(12) United States Patent
Nishino et al.

(10) Patent No.: US 11,360,394 B2
(45) Date of Patent: Jun. 14, 2022

(54) INFORMATION CALCULATION METHOD, EXPOSURE APPARATUS, EXPOSURE METHOD, DEVICE MANUFACTURING METHOD, PROGRAM, AND RECORDING MEDIUM

(71) Applicant: NIKON CORPORATION, Tokyo (JP)

(72) Inventors: Mineyuki Nishino, Tokyo (JP); Katsushi Nakano, Kumagaya (JP); Satoshi Takahashi, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 17/195,182

(22) Filed: Mar. 8, 2021

(65) Prior Publication Data

US 2021/0191277 A1    Jun. 24, 2021

Related U.S. Application Data

(60) Continuation of application No. 16/865,709, filed on May 4, 2020, now Pat. No. 10,942,457, which is a continuation of application No. 15/640,912, filed on Jul. 3, 2017, now Pat. No. 10,642,159, which is a division of application No. 14/297,988, filed on Jun. 6, 2014, now Pat. No. 9,720,332, which is a continuation of application No. PCT/JP2012/081940, filed on Dec. 10, 2012.

(60) Provisional application No. 61/568,277, filed on Dec. 8, 2011.

(51) Int. Cl.
*G03F 7/20* (2006.01)

(52) U.S. Cl.
CPC .......... *G03F 7/70341* (2013.01); *G03F 7/705* (2013.01)

(58) Field of Classification Search
CPC ............................. G03F 7/70341; G03F 7/705
See application file for complete search history.

(56) References Cited

U.S. PATENT DOCUMENTS

| | | | |
|---|---|---|---|
| 9,329,491 B2 | 5/2016 | Grouwstra et al. | |
| 9,720,332 B2 | 8/2017 | Nishino et al. | |
| 10,642,159 B2 | 5/2020 | Nishino et al. | |
| 10,942,457 B2* | 3/2021 | Nishino | G03F 7/705 |
| 2008/0043211 A1 | 2/2008 | Poon et al. | |
| 2008/0100812 A1 | 5/2008 | Poon et al. | |
| 2009/0153813 A1 | 6/2009 | Shiraishi | |
| 2009/0262316 A1 | 10/2009 | Kohno et al. | |
| 2010/0002206 A1 | 1/2010 | Kida et al. | |
| 2012/0003381 A1 | 1/2012 | Grouwstra et al. | |

FOREIGN PATENT DOCUMENTS

WO    2006/106832 A1    10/2006

OTHER PUBLICATIONS

Jan. 15, 2013 International Search Report issued in International Patent Application No. PCT/JP2012/081940.
(Continued)

*Primary Examiner* — Peter B Kim
(74) *Attorney, Agent, or Firm* — Oliff PLC

(57) ABSTRACT

An information calculation method includes: calculating liquid information regarding a liquid on an object, which faces an optical member that emits exposure light, when moving the object; and calculating region information indicating a region, in which the liquid information satisfies predetermined conditions, on the object.

7 Claims, 17 Drawing Sheets

(56) References Cited

OTHER PUBLICATIONS

Jan. 15, 2013 Written Opinion of the International Searching Authority issued in International Patent Application No. PCT/JP2012/081940.
Sep. 20, 2016 Office Action issued in U.S. Appl. No. 14/297,988.
Apr. 2, 2018 Office Action issued in U.S. Appl. No. 15/640,912.
Oct. 18, 2018 Office Action issued in U.S. Appl. No. 15/640,912.
Jun. 21, 2019 Office Action issued in U.S. Appl. No. 15/640,912.
Mar. 24, 2017 Notice of Allowance issued in U.S. Appl. No. 14/297,988.
Jun. 9, 2016 Restriction Requirement issued in U.S. Appl. No. 14/297,988.
May 21, 2020 Office Action issued in U.S. Appl. No. 16/865,709.
Nov. 9, 2020 Notice of Allowance issued in U.S. Appl. No. 16/865,709.

\* cited by examiner

INFORMATION CALCULATION METHOD, EXPOSURE APPARATUS, EXPOSURE METHOD, DEVICE MANUFACTURING METHOD, PROGRAM, AND RECORDING MEDIUM

This is a continuation of U.S. patent application Ser. No. 16/865,709 filed May 4, 2020, which is a continuation of U.S. patent application Ser. No. 15/640,912 filed Jul. 3, 2017, which is a divisional of U.S. patent application Ser. No. 14/297,988 filed Jun. 6, 2014 (now U.S. Pat. No. 9,720,332), which is a continuation of International Application No. PCT/JP2012/081940, filed on Dec. 10, 2012, which claims priority to U.S. Provisional Application No. 61/568,277, filed on Dec. 8, 2011, the contents of which are hereby incorporated by reference.

BACKGROUND

Field of the Invention

The present invention relates to an information calculation method, an exposure apparatus, an exposure method, a device manufacturing method, a program, and a recording medium.

Description of Related Art

In a process of manufacturing microdevices, such as a semiconductor device and an electronic device, an exposure apparatus that exposes a substrate with exposure light through a liquid, for example, as disclosed in U.S. Patent Application Publication No. 2008/0043211 and U.S. Patent Application Publication No. 2008/0100812, is used. The exposure apparatus includes a substrate stage that can move while holding a substrate, and exposes the substrate held on the substrate stage.

SUMMARY

In an immersion exposure apparatus, exposure failures may occur depending on the state of the immersion space. As a result, a defective device may be generated.

An object of some aspects of the present invention is to provide an information calculation method, an exposure apparatus, an exposure method, and a program, which can suppress the occurrence of exposure failure, and a recording medium. In addition, another object of some aspects of the present invention is to provide a device manufacturing method capable of suppressing the generation of a defective device.

According to a first aspect of the present invention, there is provided an information calculation method including: calculating liquid information regarding a liquid on an object, which faces an optical member that emits exposure light, when moving the object; and calculating region information indicating a region, in which the liquid information satisfies predetermined conditions, on the object.

According to a second aspect of the present invention, there is provided an information calculation method including calculating liquid information regarding a liquid on an object, which faces an optical member that emits exposure light, when moving the object on the basis of first movement information indicating movement of the object.

According to a third aspect of the present invention, there is provided an information calculation method including calculating second movement information, which indicates movement of an object arranged to face an optical member that emits exposure light, on the basis of a detection result of remaining of a liquid on the object moved according to first movement information. When the remaining of the liquid is detected in a first path from a first shot region to a second shot region indicated by the first movement information, the second movement information is calculated such that a path from the first shot region to the second shot region is longer than the first path.

According to a fourth aspect of the present invention, there is provided an information calculation method including calculating second movement information, which indicates movement of a substrate arranged to face an optical member that emits exposure light, on the basis of an inspection result of an exposure failure of the substrate that is exposed while being moved according to first movement information in a state where an immersion space is formed between the substrate and the optical member. When the exposure failure is detected in a shot region of the substrate, the second movement information is calculated such that a path of the substrate up to the shot region is longer than a path of the substrate up to the shot according to the first movement information.

According to a fifth aspect of the present invention, there is provided an immersion exposure apparatus that exposes a substrate with exposure light through an immersion space. The immersion exposure apparatus includes: an optical member that is disposed at a position facing the substrate and emits the exposure light; a liquid immersion member that forms an immersion space between the substrate and the optical member; and a control device that controls movement of the substrate on the basis of information calculated by the information calculation method according to any one of the first to fourth aspects.

According to a sixth aspect of the present invention, there is provided an immersion exposure apparatus that exposes a substrate with exposure light through an immersion space. The immersion exposure apparatus includes: an optical member that is disposed at a position facing the substrate and emits the exposure light; a liquid immersion member that forms an immersion space between the substrate and the optical member; and a control device that controls movement of the substrate so that a region, with which the immersion space is in contact during exposure of a first shot region of the substrate, is disposed outside the immersion space until a second shot region including the region is exposed after the first shot region is exposed.

According to a seventh aspect of the present invention, there is provided an immersion exposure method of exposing a substrate with exposure light through an immersion space. The immersion exposure method includes: placing an optical member, which emits the exposure light, at a position facing the substrate; forming an immersion space between the substrate and the optical member; and controlling movement of the substrate on the basis of information calculated by the information calculation method according to any one of the first to fourth aspects.

According to an eighth aspect of the present invention, there is provided an immersion exposure method of exposing a substrate with exposure light through an immersion space. The immersion exposure method includes: placing an optical member, which emits the exposure light, at a position facing the substrate; forming an immersion space between the substrate and the optical member; and controlling movement of the substrate so that a region, with which the immersion space is in contact during exposure of a first shot region of the substrate, is disposed outside the immersion space until a second shot region including the region is exposed after the first shot region is exposed.

According to a ninth aspect of the present invention, there is provided a device manufacturing method including: exposing a substrate with the exposure apparatus according to the fifth or sixth aspect; and developing the exposed substrate.

According to a tenth aspect of the present invention, there is provided a device manufacturing method including: exposing a substrate using the exposure method according to the fifth or sixth aspect; and developing the exposed substrate.

According to an eleventh aspect of the present invention, there is provided a program causing a computer to execute: calculating liquid information regarding a liquid on an object, which faces an optical member that emits exposure light, when moving the object; and calculating region information indicating a region, in which the liquid information satisfies predetermined conditions, on the object.

According to a twelfth aspect of the present invention, there is provided a program causing a computer to execute calculating liquid information regarding a liquid on an object, which faces an optical member that emits exposure light, when moving the object on the basis of first movement information indicating movement of the object.

According to a thirteenth aspect of the present invention, there is provided a program causing a computer to execute calculating second movement information, which indicates movement of an object arranged to face an optical member that emits exposure light, on the basis of a detection result of remaining of a liquid on the object moved according to first movement information. When the remaining of the liquid is detected in a first path from a first shot region to a second shot region indicated by the first movement information, the second movement information is calculated such that a path from the first shot region to the second shot region is longer than the first path.

According to a fourteenth aspect of the present invention, there is provided a program causing a computer to execute calculating second movement information, which indicates movement of a substrate arranged to face an optical member that emits exposure light, on the basis of an inspection result of an exposure failure of the substrate that is exposed while being moved according to first movement information in a state where an immersion space is formed between the substrate and the optical member. When the exposure failure is detected in a shot region of the substrate, the second movement information is calculated such that a path of the substrate up to the shot region is longer than a path of the substrate up to the shot region according to the first movement information.

According to a fifteenth aspect of the present invention, there is provided a computer-readable recording medium on which the program according to any one of the eleventh to fourteenth aspects is recorded.

According to the aspects of the present invention, it is possible to provide an information calculation method capable of suppressing the occurrence of exposure failure. In addition, according to the aspects of the present invention, it is possible to provide an exposure apparatus capable of suppressing the occurrence of exposure failure. According to the seventh and eighth aspects of the present invention, it is possible to provide an exposure method capable of suppressing the occurrence of exposure failure. In addition, according to the aspect of the present invention, it is possible to provide a device manufacturing method capable of suppressing the generation of a defective device. In addition, according to the aspects of the present invention, it is possible to provide a program capable of suppressing the occurrence of exposure failure. In addition, according to the aspect of the present invention, it is possible to provide a recording medium capable of suppressing the occurrence of exposure failure.

DESCRIPTION OF EMBODIMENTS

Hereinafter, an embodiment of the present invention will be described with reference to the diagrams. However, the present invention is not limited thereto.

Figure 1:
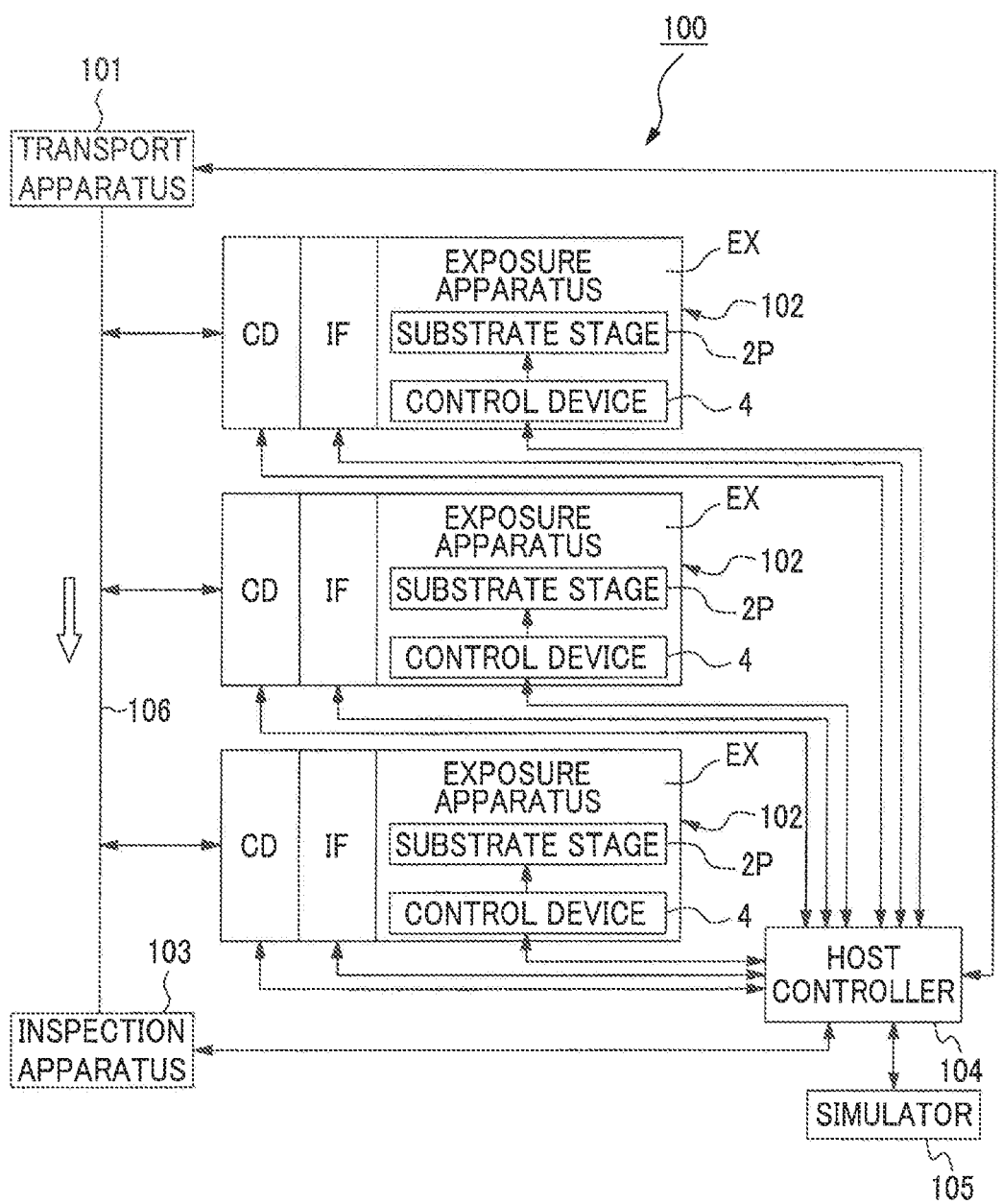
FIG. 1 is a diagram showing the configuration of a device manufacturing system of the present embodiment.

FIG. 1 is a diagram showing the configuration of a device manufacturing system 100 of the present embodiment. The device manufacturing system 100 shown in FIG. 1 includes a transport apparatus 101 that transports a substrate, a substrate processing apparatus 102 that processes the substrate, an inspection apparatus 103 that inspects the substrate processed by the substrate processing apparatus 102, a host controller 104 that controls at least a part of the device manufacturing system 100, and a simulator 105 (information calculating apparatus) that supplies information to the host controller 104.

In the present embodiment, the transport apparatus 101 transports a substrate along a transport line 106. For example, the transport apparatus 101 transports a plurality of substrates as a set by transporting a case in which a plurality of substrates are contained. In the present embodiment, the device manufacturing system 100 includes a plurality of substrate processing apparatuses 102, and each of the plurality of substrate processing apparatuses 102 is connected to the transport line 106. In the present embodiment, the transport apparatus 101 performs a loading process, which is for loading (supplying) a substrate into the substrate processing apparatus 102 through the transport line 106, for each of the plurality of substrate processing apparatuses 102. In addition, in the present embodiment, the transport apparatus 101 performs an unloading process of unloading the substrate processed by the substrate processing apparatus 102 from each of the plurality of substrate processing apparatuses 102 through the transport line 106.

In the present embodiment, the host controller 104 controls the transport apparatus 101 to perform one or both of the loading process and the unloading process of the substrate processing apparatus 102. In addition, the host controller 104 of the present embodiment manages to which of the plurality of substrate processing apparatuses 102 a substrate before processing, which is being transported along the transport line 106, is to be supplied by controlling the transport apparatus 101. In addition, in the present embodiment, the host controller 104 manages by which of the plurality of substrate processing apparatuses 102 a substrate after processing, which is being transported along the transport line 106, is to be processed by controlling the transport apparatus 101.

In the present embodiment, the substrate processing apparatus 102 includes a coating and developing apparatus CD connected to the transport line 106, an interface IF connected to the coating and developing apparatus CD, and an exposure apparatus EX connected to the coating and developing apparatus CD through the interface IF.

The exposure apparatus EX of the present embodiment is an immersion exposure apparatus for exposing a substrate through a liquid. The exposure apparatus EX of the present embodiment includes a substrate stage 2P on which a substrate is disposed through the transport line 106. The exposure apparatus EX of the present embodiment exposes the substrate disposed on the substrate stage 2P while relatively moving the substrate stage 2P, on which the substrate is disposed, in the exposure apparatus EX. The exposure apparatus EX of the present embodiment includes a control device 4 that controls the relative movement of the substrate stage 2P. In addition, the exposure apparatus EX of the present embodiment includes a transport system 10 (shown in FIG. 2 and the like) to transport a substrate. The transport system 10 can perform a process of loading a substrate onto the substrate stage 2P and a process of unloading the substrate from the substrate stage 2P.

In the present embodiment, the coating and developing apparatus CD includes a coating apparatus that forms a thin film on a substrate and a developing apparatus that develops the substrate exposed by the exposure apparatus EX. Examples of the thin film formed on the substrate include a film formed of a photosensitive material that is formed on a base, such as a semiconductor wafer, and a film called a top-coat film that covers the film formed of a photosensitive material.

In the present embodiment, the transport system 10 of the exposure apparatus EX loads a substrate, on which a thin film has been formed by the coating apparatus of the coating and developing apparatus CD, from the coating apparatus onto the substrate stage 2P of the exposure apparatus EX through the interface IF. In the present embodiment, the transport system 10 of the exposure apparatus EX unloads a substrate, which has been exposed by the exposure apparatus EX, from the substrate stage 2P of the exposure apparatus EX to the developing apparatus of the coating and developing apparatus CD through the interface IF.

In the present embodiment, the host controller 104 controls each unit of the substrate processing apparatus 102. For example, the host controller 104 controls the coating and developing apparatus CD to perform a process of forming a thin film on the substrate loaded into the coating apparatus through the transport line 106. In addition, the host controller 104 controls the exposure apparatus EX and the interface IF to perform a process of loading the substrate, on which a thin film has been formed by the coating apparatus, into the exposure apparatus EX. In addition, the host controller 104 controls the exposure apparatus EX to perform an exposure process on the substrate loaded into the exposure apparatus EX from the coating and developing apparatus CD. In the present embodiment, the control device 4 controls each unit of the exposure apparatus EX according to a command from the host controller 104, so that the exposure apparatus EX performs an exposure process. The host controller 104 controls the exposure apparatus EX and the interface IF to perform a process of unloading the substrate, which has been exposed by the exposure apparatus EX, from the exposure apparatus EX to the developing apparatus of the coating and developing apparatus CD. The host controller 104 controls the coating and developing apparatus CD to perform a process of developing the substrate unloaded from the exposure apparatus EX to the developing apparatus.

In addition, some apparatuses of the substrate processing apparatus 102 described above may be omitted. For example, the substrate processing apparatus 102 may include the exposure apparatus EX but may not include the coating and developing apparatus CD. For example, the coating and developing apparatus CD may be an apparatus provided outside the substrate processing apparatus 102. In addition, some apparatuses of the coating and developing apparatus CD may be omitted, or may be apparatuses provided outside the coating and developing apparatus CD. In addition, for example, as the transport system 10 (to be described later) of the exposure apparatus EX, some apparatuses of the exposure apparatus EX may be a part of the interface IF or may be a part of the coating and developing apparatus CD.

The inspection apparatus 103 of the present embodiment is connected on the more downstream side of the transport path than the substrate processing apparatus 102 in the transport line 106. In the present embodiment, the inspection apparatus 103 detects a result of the exposure process on the substrate. In the present embodiment, the inspection apparatus 103 inspects a substrate developed by the developing apparatus after the exposure process is performed by the exposure apparatus EX. In the present embodiment, for example, the inspection apparatus 103 detects a pattern of a film, which is formed of a photosensitive material, in the developed substrate and compares the detected pattern with a predetermined pattern, thereby detecting the result of the exposure process on the substrate. The inspection apparatus 103 can detect an exposure failure due to mixing of air bubbles into the immersion space, for example. In addition, the inspection apparatus 103 can detect an exposure failure due to watermarks by the liquid separated from the immersion space, for example.

In the present embodiment, the inspection apparatus 103 supplies information indicating the result of the exposure process to the host controller 104. For example, exposure result information indicating the result of the exposure process includes information indicating whether or not exposure failure has occurred in the substrate. For example, the information indicating the result of the exposure process may include information indicating one or both of a position and a region where exposure failure has occurred in the substrate. For example, the information indicating the result of the exposure process may include information indicating one or both of a position and a region where exposure failure has not occurred in the substrate.

In addition, the inspection apparatus 103 may inspect a substrate etched with a film formed of a developed photosensitive material as a mask. For example, the inspection apparatus 103 may detect a pattern formed on the substrate by etching. The inspection apparatus 103 may detect the result of the exposure process described above by detecting a pattern formed on the substrate by development or etching, thereby inspecting exposure failure, for example. In addition, the inspection apparatus 103 may be a part of the substrate processing apparatuses 102. For example, the inspection apparatus 103 may be a part of the coating and developing apparatus CD. In addition, the inspection apparatus 103 may not supply the information indicating the inspection result to the host controller 104, or may be an apparatus provided outside the device manufacturing system 100, or may be omitted.

The host controller 104 of the present embodiment controls each unit of the device manufacturing system 100, for example, according to the command of the operator to perform various kinds of processing described above.

The host controller 104 of the present embodiment acquires operating condition information, which indicates the operating conditions of each of the plurality of substrate processing apparatuses 102, from each of the plurality of substrate processing apparatuses 102. The host controller 104 of the present embodiment can acquire the operating condition information, which indicates the operating conditions of each of the plurality of exposure apparatuses EX, from each control device 4 of the plurality of exposure apparatuses EX. In the present embodiment, the operating conditions of the exposure apparatus EX include at least one of the condition (movable range) of a position to which the substrate stage 2P can move, the condition of the speed at which the substrate stage 2P moves, and the condition of the acceleration at which the substrate stage 2P moves. The condition of the speed includes a speed range including at least one of the upper limit, average value, and recommended value of the speed at which the substrate stage 2P moves, for example. The condition of the acceleration include an acceleration range including at least one of the upper limit, average value, and recommended value of the acceleration at which the substrate stage 2P moves, for example. The host controller 104 stores the operating condition information acquired from the substrate processing apparatus 102 in a storage device (not shown).

The host controller 104 of the present embodiment acquires inspection result information, which indicates an inspection result of the exposed substrate, from the inspection apparatus 103. In the present embodiment, the host controller 104 stores the inspection result information acquired from the inspection apparatus 103 in a storage device (not shown).

The simulator 105 of the present embodiment calculates information including liquid information regarding the liquid (immersion space) on an object that is disposed so as to face a projection optical system, which will be described later, in the exposure apparatus EX. The object includes an exposure substrate, for example. In the present embodiment, the host controller 104 supplies at least some of the information, which is acquired from each unit of the device manufacturing system 100, to the simulator 105. For example, the host controller 104 supplies the information acquired from the exposure apparatus EX to the simulator 105. In the present embodiment, the simulator 105 calculates the information including the liquid information on the basis of the information supplied from the host controller 104. In addition, when the simulator 105 calculates the information including the liquid information, the information from the exposure apparatus EX that is supplied to the simulator 105 may not be used, or the information from the exposure apparatus EX may not be supplied to the simulator 105.

In the present embodiment, the simulator 105 supplies at least some of the calculated information to the host controller 104. In the present embodiment, the host controller 104 stores the information supplied from the simulator 105 in a storage device (not shown). In the present embodiment, the host controller 104 controls the control device 4 of the exposure apparatus EX on the basis of the information supplied from the simulator 105. For example, the host controller 104 controls the movement of the substrate stage 2P on which the substrate irradiated with exposure light is disposed.

In addition, information transmission between the host controller 104 and the simulator 105 may be performed by cable or radio communication, or may be performed through a recording medium. For example, the host controller 104 may acquire information calculated by the simulator 105 by reading the information from a recording medium on which the information calculated by the simulator 105 is recorded. In addition, the host controller 104 may supply no information to the simulator 105. In addition, the simulator 105 may not supply the calculated information to the host controller 104. The device manufacturing system 100 may not include the simulator 105, for example, when there is no transmission of information between the host controller 104 and the simulator. In addition, the simulator 105 may be a part of the host controller 104, or may be a part of the exposure apparatus EX, may be an apparatus provided outside the device manufacturing system 100. In addition, the simulator 105 may be separately mounted in the host controller 104 and the exposure apparatus EX.

In addition, the number of substrate processing apparatuses 102 provided in the device manufacturing system 100 may be one or may be two or more. In addition, the device manufacturing system 100 may not include the host controller 104. For example, in the device manufacturing system 100, the host controller 104 is omitted, and the simulator 105 may be connected to the control device 4 of the exposure apparatus EX, or the simulator 105 may not be connected to the control device 4 of the exposure apparatus EX.

Figure 2:
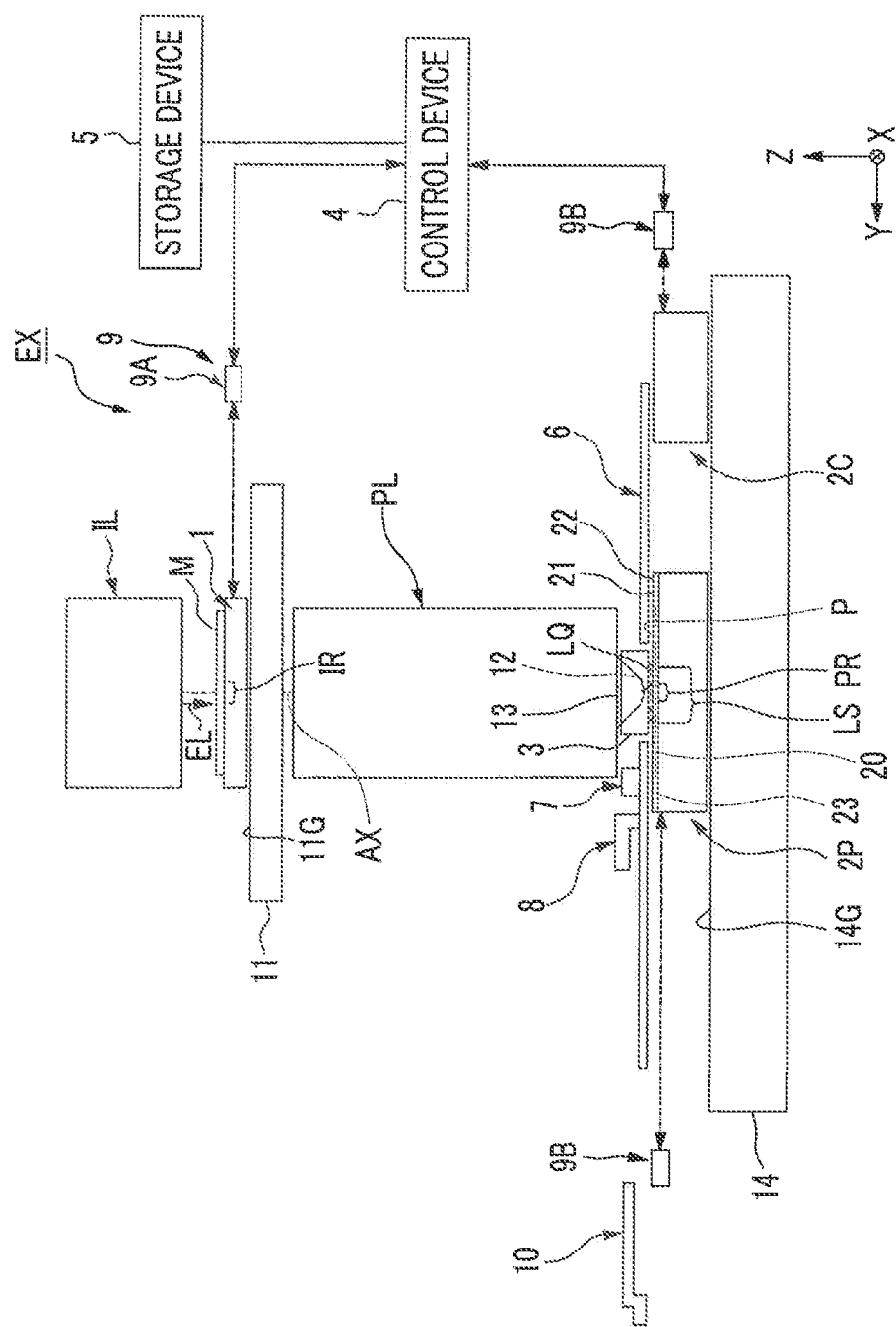
FIG. 2 is a schematic configuration diagram showing an example of an exposure apparatus of the present embodiment.
Figure 3:
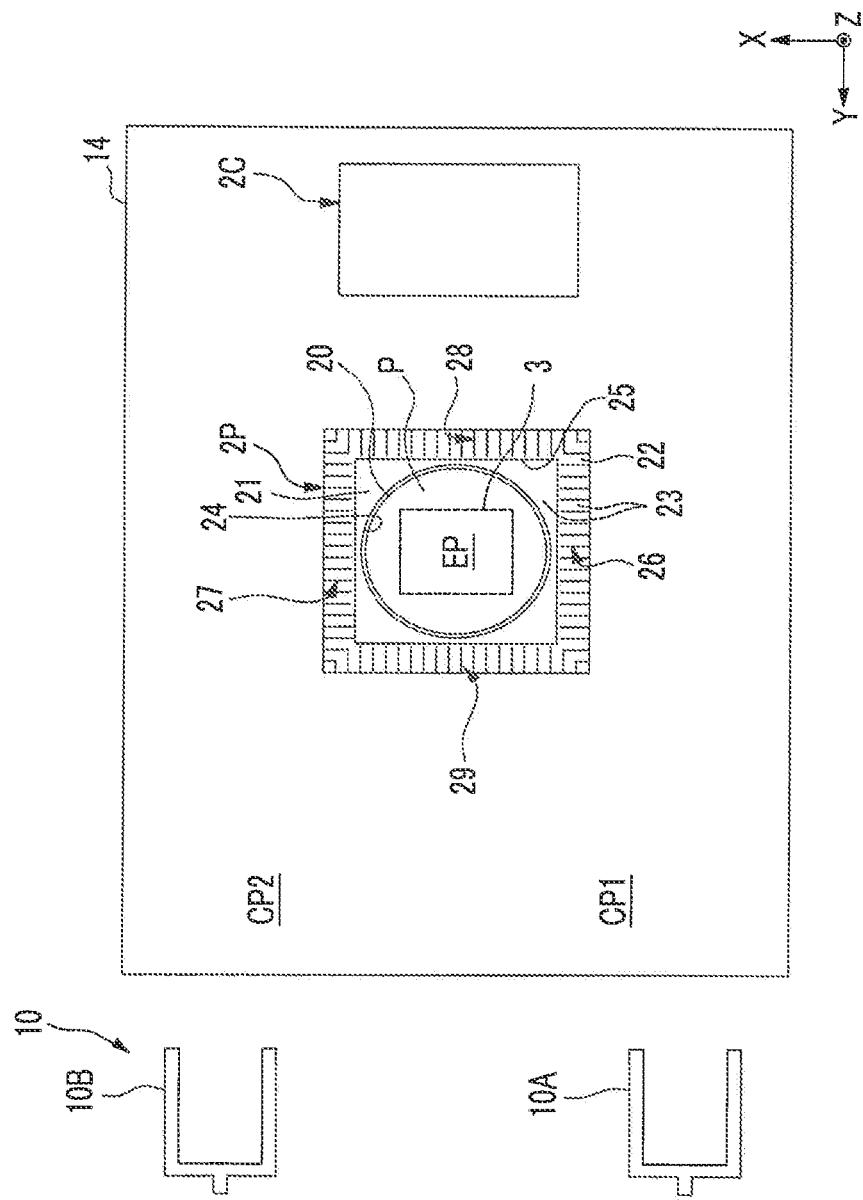
FIG. 3 is a plan view showing an example of a substrate stage and a measuring stage of the present embodiment.

Next, each unit of the device manufacturing system 100 will be described. FIG. 2 is a schematic configuration diagram showing an example of the exposure apparatus EX according to the present embodiment. FIG. 3 is a plan view showing an example of the substrate stage 2P and a measuring stage 2C according to the present embodiment.

In the following explanation, an XYZ orthogonal coordinate system shown in FIG. 2 and the like is set, and the positional relationship of respective units will be described with reference to the XYZ orthogonal coordinate system. A predetermined direction within the horizontal plane is set to an X-axis direction, a direction perpendicular to the X-axis direction within the horizontal plane is set to a Y-axis direction, and a direction (that is, a vertical direction) perpendicular to each of the X-axis direction and the Y-axis direction is set to a Z-axis direction. In addition, rotation (inclination) directions around the X, Y, and Z axes are set to ex, e, and OZ directions, respectively.

The exposure apparatus EX of the present embodiment is an immersion exposure apparatus that exposes a substrate P with exposure light EL through a liquid LQ. In the present embodiment, immersion space LS is formed so that at least a part of the optical path of the exposure light EL is filled with the liquid LQ. The immersion space refers to a portion (space, region) filled with liquid. The substrate P is exposed with the exposure light EL through the liquid LQ of the immersion space LS. In the present embodiment, water (pure water) is used as the liquid LQ.

In addition, the exposure apparatus EX of the present embodiment is an exposure apparatus including the substrate stage 2P and the measuring stage 2C, for example, as disclosed in U.S. Pat. No. 6,897,963 and European Patent Application Publication No. 1,713,113.

In FIGS. 2 and 3, the exposure apparatus EX includes: a mask stage 1 that is movable while holding a mask M; the substrate stage 2P that is movable while holding the substrate P; the measuring stage 2C that is movable in a state where a measuring device (for example, at least some sensors that receive the exposure light EL), a measuring member, and the like are mounted thereon without holding the substrate P; an illumination system IL that illuminates the mask M with the exposure light EL; a projection optical system PL that projects an image of a pattern of the mask M illuminated with the exposure light EL onto the substrate P; a liquid immersion member 3 that forms the immersion space LS by holding the liquid LQ between the liquid immersion member 3 and the substrate P so that the optical path of the exposure light EL irradiated onto the substrate P is filled with the liquid LQ; the control device 4 that controls the overall operation of the exposure apparatus EX; and a storage device 5 that is connected to the control device 4 and stores various kinds of information regarding exposure. The storage device 5 includes a memory, such as a RAM, and a recording medium, such as a hard disk or a CD-ROM, for example. In the storage device 5, an operating system (OS) for controlling a computer system is installed, and a program for controlling the exposure apparatus EX is stored.

In addition, the exposure apparatus EX of the present embodiment includes an encoder system 6 that measures the position of the substrate stage 2P using a scale member 22 provided in the substrate stage 2P, for example, as disclosed in U.S. Patent Application Publication No. 2007/0288121.

In addition, the exposure apparatus EX of the present embodiment includes a first detection system 7 that detects the position of the surface of the substrate P, a second detection system 8 that detects the position of the substrate P, and an interferometer system 9 that measures the positions of the mask stage 1, the substrate stage 2P, and the measuring stage 2C.

In addition, in the present embodiment, the exposure apparatus EX includes the transport system 10 to transport the substrate P. The transport system 10 can perform a process of loading the substrate P onto the substrate stage 2P and a process of unloading the substrate P from the substrate stage 2P.

The mask M includes a reticle in which a device pattern projected onto the substrate P is formed. The mask M may be a light-transmissive mask including a transparent plate, such as a glass plate, and a pattern that is formed on the transparent plate using a light blocking material, such as chromium, for example. In addition, a reflective mask may be used as the mask M.

The substrate P is a substrate for manufacturing a device. The substrate P includes a base, such as a semiconductor wafer, and a photosensitive film formed on the base, for example. The photosensitive film is a film formed of a photosensitive material (photoresist). In addition, the substrate P may include another film in addition to the photosensitive film. For example, the substrate P may include an anti-reflection film, or may include a protective film (top-coat film) that protects the photosensitive film.

The illumination system IL irradiates a predetermined illumination region IR with the exposure light EL. The illumination region IR includes a position that can be irradiated by the exposure light EL emitted from the illumination system IL. The illumination system IL illuminates at least a part of the mask M disposed in the illumination region IR with the exposure light EL having a uniform illuminance distribution. As the exposure light EL emitted from the illumination system IL, for example, deep ultraviolet light (DUV light), such as emission lines (g-ray, h-ray, and i-ray) emitted from a mercury lamp and KrF excimer laser light (wavelength: 248 nm), and vacuum ultraviolet light (VUV light), such as ArF excimer laser light (wavelength: 193 nm) and $F_2$ laser light (wavelength: 157 nm), are used. In the present embodiment, ArF excimer laser light, which is ultraviolet light (vacuum ultraviolet light), is used as the exposure light EL.

The mask stage 1 can move on a guide surface 11G of a base member 11 including the illumination region IR in a state of holding the mask M. In the present embodiment, the guide surface 11G and the XY plane are substantially parallel to each other. The mask stage 1 moves by the operation of a driving system including a planar motor disclosed in U.S. Pat. No. 6,452,292, for example. The planar motor includes a movable element disposed in the mask stage 1 and a stator disposed in the base member 11. In the present embodiment, the mask stage 1 can move in six directions of the X, Y, and Z-axis directions and the OX, OY, and OZ directions on the guide surface 11G by the operation of the driving system. In addition, the driving system that moves the mask stage 1 may not be a planar motor. For example, the driving system may include a linear motor.

The projection optical system PL irradiates a predetermined projection region PR with the exposure light EL. The projection region PR includes a position that can be irradiated by the exposure light EL emitted from the projection optical system PL. The projection optical system PL projects an image of the pattern of the mask M onto at least a part of the substrate P disposed in the projection region PR with a predetermined projection magnification. The projection optical system PL of the present embodiment is a reduced magnification optical system the projection magnification of which is ¼, ⅕, or ⅛, for example. In addition, the projection optical system PL may also be either a unit magnification system or an enlargement magnification optical system. In the present embodiment, the optical axis AX of the projection optical system PL is parallel to the Z axis. In addition, the projection optical system PL may be any of a dioptric system that does not include a reflective optical element, a catadioptric optical system that does not include a refraction optical element, and a catadioptric system that includes both a reflective optical element and a refraction optical element. In addition, the projection optical system PL may form either an inverted image or an erect image.

The projection optical system PL has an emission surface 13 from which the exposure light EL is emitted toward the image surface of the projection optical system PL. A terminating optical element 12 closest to the image surface of the projection optical system PL, among a plurality of optical elements of the projection optical system PL, has the emission surface 13. The projection region PR includes a position that can be irradiated by the exposure light EL emitted from the emission surface 13. In the present embodiment, the emission surface 13 faces −Z side and is parallel to the XY plane. In addition, the emission surface 13 facing the −Z side may be a convex surface or may be a concave surface. The optical axis of the terminating optical element 12 is parallel to the Z axis. In the present embodiment, the exposure light EL emitted from the emission surface 13 travels to the −Z side.

The substrate stage 2P can move on a guide surface 14G of a base member 14 including the projection region PR in a state of holding the substrate P. In the present embodiment, the guide surface 14G and the XY plane are substantially parallel to each other. The measuring stage 2C can move on the guide surface 14G of the base member 14 including the projection region PR in a state where a measuring device (measuring member) is mounted thereon. The substrate stage 2P and the measuring stage 2C move by the operation of the driving system including the planar motor disclosed in U.S. Pat. No. 6,452,292, for example. The planar motor includes a movable element disposed in each of the substrate stage 2P and the measuring stage 2C and a stator disposed in the base member 14. In the present embodiment, each of the substrate stage 2P and the measuring stage 2C can move in six directions of the X, Y, and Z-axis directions and the θX, θY, and θZ directions on the guide surface 14G by the operation of the driving system. In addition, the driving system that moves the substrate stage 2P and the measuring stage 2C may not be a planar motor. For example, the driving system may include a linear motor.

The interferometer system 9 includes a laser interferometer unit 9A, which measures the position of the mask stage 1 using a measuring mirror disposed in the mask stage 1, and a laser interferometer unit 9B, which measures the positions of the substrate stage 2P and the measuring stage 2C using a measuring mirror disposed in the substrate stage 2P and a measuring mirror disposed in the measuring stage 2C. Measurement results of the laser interferometer units 9A and 9B are output to the control device 4.

The substrate stage 2P includes a first holding member 20 that releasably holds the substrate P. In addition, in the present embodiment, the substrate stage 2P includes a cover member 21 disposed in at least a part of a surrounding of the first holding member 20. In addition, in the present embodiment, the substrate stage 2P includes the scale member 22 disposed in at least a part of a surrounding of the cover member 21. The scale member 22 moves by the movement of the substrate stage 2P. For example, the scale member 22 moves when the substrate stage 2P moves within the XY plane along the guide surface 14G.

In the present embodiment, the substrate stage 2P includes a second holding member 23 disposed in at least a part of a surrounding of the first holding member 20. The second holding member 23 releasably holds the cover member 21. The cover member 21 held on the second holding member 23 is disposed in at least a part of a surrounding of the substrate P held on the first holding member 20. In the present embodiment, the cover member 21 has an opening 24. In the present embodiment, the substrate P held on the first holding member 20 is disposed inside the opening 24 of the cover member 21 held on the second holding member 23. That is, in the present embodiment, the cover member 21 held on the second holding member 23 is disposed so as to annularly surround the substrate P held on the first holding member 20.

In the present embodiment, the second holding member 23 releasably holds the scale member 22. The scale member 22 can be detached from the second holding member 23 separately from the cover member 21. The scale member 22 held on the second holding member 23 is disposed in at least a part of a surrounding of the cover member held on the second holding member 23. The cover member 21 held on the second holding member 23 is disposed in at least a part of the region between the substrate P held on the first holding member 20 and the scale member 22 held on the second holding member 23. In the present embodiment, the scale member 22 has an opening 25. In the present embodiment, the cover member 21 held on the second holding member 23 is disposed inside the opening 25 of the scale member 22 held on the second holding member 23. In the present embodiment, the scale member 22 held on the second holding member 23 is disposed so as to annularly (in a frame shape) surround the cover member 21 held on the second holding member 23.

In the present embodiment, the scale member 22 includes Y scales 26 and 27 for measuring the position of the substrate stage 2P in the Y-axis direction and X scales 28 and 29 for measuring the position of the substrate stage 2P in the X-axis direction. The Y scale 26 is disposed on the −X side with respect to the opening 24 (center of the first holding member 20). The Y scale 27 is disposed on the +X side with respect to the opening 24. The X scale 28 is disposed on the −Y side with respect to the opening 24. The X scale 29 is disposed on the +Y side with respect to the opening 24.

Each of the Y scales 26 and 27 includes a plurality of gratings (grid lines) that are long in the X-axis direction and are disposed in the Y-axis direction at predetermined pitches therebetween. That is, each of the Y scales 26 and 27 includes one-dimensional gratings whose periodic direction is the Y-axis direction. Each of the X scales 28 and 29 includes a plurality of gratings (grid lines) that are long in the Y-axis direction and are disposed in the X-axis direction at predetermined pitches therebetween. That is, each of the X scales 28 and 29 includes one-dimensional gratings whose periodic direction is the X-axis direction.

In the present embodiment, the grating is a diffraction grating. That is, in the present embodiment, each of the Y scales 26 and 27 has diffraction gratings whose periodic direction is the Y-axis direction. Each of the X scales 28 and 29 has diffraction gratings whose periodic direction is the X-axis direction. In addition, in the present embodiment, each of the Y scales 26 and 27 is a reflective scale in which reflective gratings (reflective diffraction gratings) whose periodic direction is the Y-axis direction are formed. Each of the X scales 28 and 29 is a reflective scale in which reflective gratings (reflective diffraction gratings) whose periodic direction is the X-axis direction are formed.

In the present embodiment, the transport system 10 includes a first transport member 10A for loading the substrate P onto the substrate stage 2P and a second transport member 10B for unloading the substrate P from the substrate stage 2P. The first transport member 10A loads, for example, the substrate P before exposure onto the first holding member 20 of the substrate stage 2P. The second transport member 10B unloads, for example, the substrate P after exposure from the first holding member 20 of the substrate stage 2P.

In the present embodiment, the substrate stage 2P can move among a position EP where at least a part of the substrate stage 2P faces the emission surface 13, a position CP1 where the substrate stage 2P does not face the emission surface 13, and a position CP2 where the substrate stage 2P does not face the emission surface 13.

In the present embodiment, an object disposed at the position EP can be irradiated with the exposure light EL emitted from the emission surface 13. In the present embodiment, at the position CP1, processing for loading the substrate P before exposure onto the first holding member 20 is performed. At the position CP2, processing for unloading the substrate P after exposure from the first holding member 20 is performed.

In the following explanation, the position EP will be appropriately referred to as an exposure position EP. In addition, in the following explanation, the position CP1 will be appropriately referred to as a first substrate replacement position CP1, and the position CP2 will be appropriately referred to as a second substrate replacement position CP2.

In the present embodiment, the first and second substrate replacement positions CP1 and CP2 are positions on the +Y side with respect to the exposure position EP. In the present embodiment, the first substrate replacement position CP1 is a position on the −X side with respect to the second substrate replacement position CP2.

When loading the substrate P onto the first holding member 20, the control device 4 moves the substrate stage 2P to the first substrate replacement position CP1. The control device 4 loads the substrate P onto the first holding member 20 of the substrate stage 2P, which is disposed at the first substrate replacement position CP1, using the first transport member 10A.

When unloading the substrate P from the first holding member 20, the control device 4 moves the substrate stage 2P to the second substrate replacement position CP2. The control device 4 unloads the substrate P from the first holding member 20 of the substrate stage 2P, which is disposed at the second substrate replacement position CP2, using the second transport member 10B.

Figure 4:
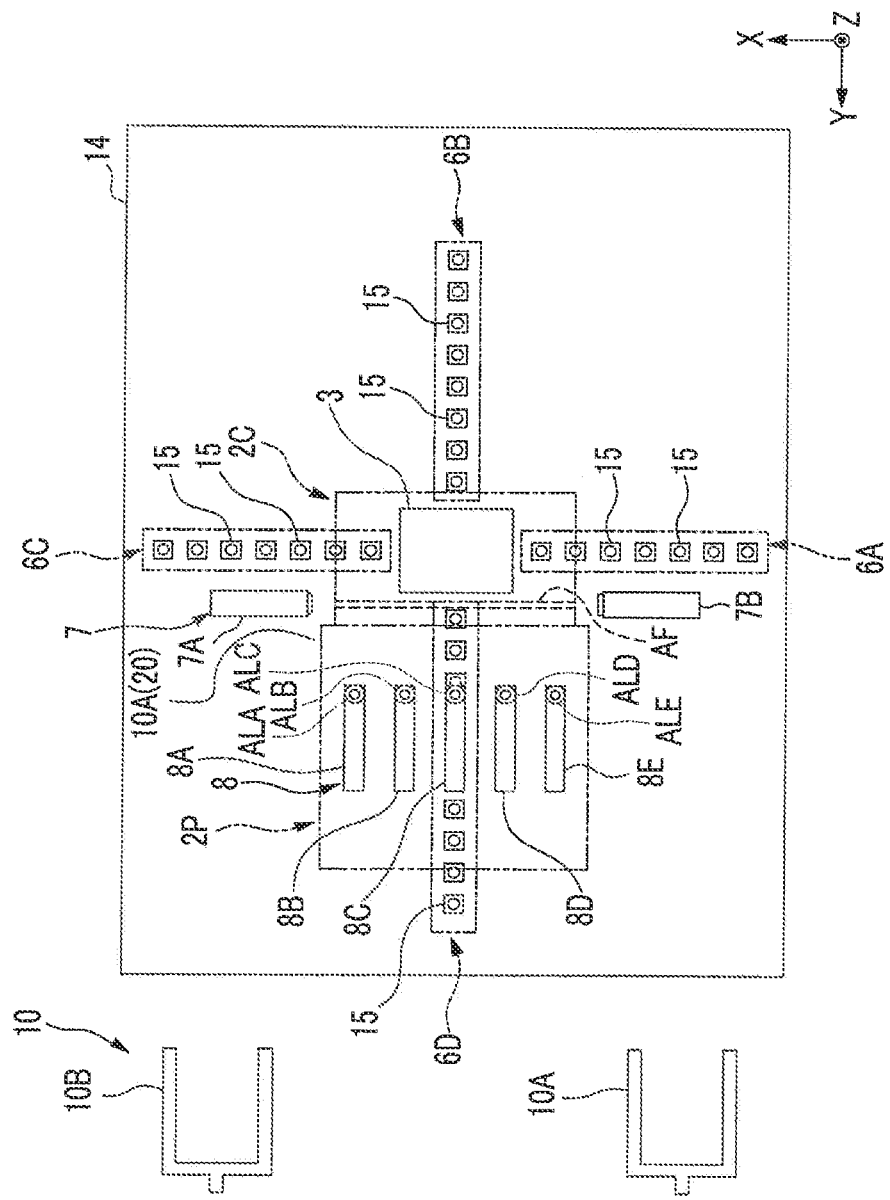
FIG. 4 is a plan view showing an example of an encoder system, a first detection system, and a second detection system of the present embodiment.

FIG. 4 is a plan view showing an example of the encoder system 6, the first detection system 7, and the second detection system 8.

The first detection system 7 includes a so-called oblique incidence type multipoint focus and level detection system, for example, as disclosed in U.S. Pat. No. 5,448,332 and the like. The first detection system 7 includes an irradiation device 7A that emits detection light and a light receiving device 7B that can receive detection light. The first detection system 7 irradiates a detection region AF with detection light, which is emitted from the irradiation device 7A, to detect the position of the surface (inspection surface) of an object disposed in the detection region AF. The detection light from the irradiation device 7A that has been irradiated onto the surface of the object is reflected on the surface of the object. At least some of the detection light beams reflected on the surface of the object are received by the light receiving device 7B. The first detection system 7 detects the position of the surface of the object, for example, in the Z-axis, OX, and OY directions, on the basis of the light receiving result of the light receiving device 7B.

In the present embodiment, the detection region AF of the first detection system 7 is disposed between the first and second substrate replacement positions CP1 and CP2 and the exposure position EP. The first detection system 7 detects the position of the surface of the object between the first and second substrate replacement positions CP1 and CP2 and the exposure position EP. In other words, the first detection system 7 detects the position of the surface of the object disposed between the first and second substrate replacement positions CP1 and CP2 and the exposure position EP.

In the present embodiment, for example, the first detection system 7 can detect the position of the surface of the substrate P held on the first holding member 20 and the position of the surface of the scale member 22. In addition, the first detection system 7 may detect the position of the surface of the measuring stage 2C.

In the present embodiment, the first detection system 7 can detect the remaining of the liquid on the substrate P through which the immersion space LS has passed. In the present embodiment, the first detection system 7 detects the liquid remaining on the substrate P after exposure. For example, the control device 4 can detect at least one of the presence of the liquid remaining on the surface of the substrate P after exposure, the position, and the number on the basis of an output of the light receiving device 7B of the first detection system 7. In the present embodiment, the information regarding the residual liquid that is detected using the first detection system 7 is supplied to the control device 4, and can be supplied to the simulator 105 through the control device 4 and the host controller 104. In addition, if possible, residual liquid on the surface of the substrate P may be detected by the first detection system 7 in parallel with at least a part of the exposure process.

In addition, the first detection system 7 may not detect the remaining of the liquid on the substrate P through which the immersion space LS has passed. In addition, a different apparatus from the first detection system 7 may detect the remaining of liquid on the substrate P through which the immersion space LS has passed. This apparatus may be a part of the exposure apparatus EX, or may be an apparatus provided outside the exposure apparatus EX.

The second detection system 8 includes an alignment apparatus based on a field image alignment (FIA) method that irradiates a target mark with broadband detection light by which the photosensitive film of the substrate P is not exposed, captures an image of the target mark, which is formed on the light receiving surface by detection light reflected by the target mark, and a mark image using an image capturing device or an image sensing device, such as a CCD, and measures the position of the target mark by performing image processing on these imaging signals, for example, as disclosed in U.S. Pat. No. 5,493,403. In the present embodiment, the second detection system 8 includes a plurality of alignment apparatuses 8A to 8E. In the present embodiment, the plurality of alignment apparatuses 8A to 8E are disposed in the X-axis direction.

The alignment apparatus 8A irradiates a detection region ALA with detection light to detect the position of the target mark disposed in the detection region ALA. The detection light irradiated to the target mark is reflected by the target mark. An image of the target mark based on the detection light reflected by the target mark is captured by an image capturing device or an image sensing device. For example, the alignment apparatus 8A detects the position of the target mark in the Z-axis, OX, and OY directions on the basis of the imaging result of the image capturing device or the image sensing device. Similarly, the alignment apparatuses 8B to 8E irradiate detection regions ALB to ALE with detection light to detect the positions of the target marks disposed in the detection regions ALB to ALE, respectively.

In the present embodiment, the detection regions ALA to ALE of the second detection system 8 are disposed in the X-axis direction. In addition, the detection regions ALA to ALE are disposed between the first and second substrate replacement positions CP1 and CP2 and the exposure position EP. The second detection system 8 detects the position of the target mark between the first and second substrate replacement positions CP1 and CP2 and the exposure position EP. In other words, the second detection system 8 detects the position of the target mark disposed between the first and second substrate replacement positions CP1 and CP2 and the exposure position EP.

In addition, in the present embodiment, the second detection system 8 is disposed closer to the +Y side than the first detection system 7 is. In the present embodiment, the detection regions ALA to ALE are disposed closer to the +Y side than the detection region AF is. In other words, the detection regions ALA to ALE are disposed between the first and second substrate replacement positions CP1 and CP2 and the detection region AF.

In the present embodiment, for example, the second detection system 8 can detect the position of the alignment mark of the substrate P held on the first holding member 20. In addition, the second detection system 8 may detect the position of the mark disposed on the measuring stage 2C, for example.

The encoder system 6 includes an encoder head 15 that includes an irradiation apparatus which emits measurement light and a light receiving apparatus which receives the measurement light and that irradiates a grating (scale, grid line) provided in the scale member 22 with the measurement light from the irradiation apparatus and receives the measurement light through the grating with the light receiving apparatus to measure the position of the grating, for example, as disclosed in U.S. Patent Application Publication No. 2007/0288121.

In the present embodiment, the encoder system 6 includes a plurality of encoder heads 15. The encoder system 6 includes a linear encoder 6A that includes a plurality of encoder heads 15 disposed in the X-axis direction and are disposed on the −X side of the terminating optical element 12 (liquid immersion member 3), a linear encoder 6B that includes a plurality of encoder heads 15 disposed in the Y-axis direction and are disposed on the −Y side of the terminating optical element 12 (liquid immersion member 3), a linear encoder 6C that includes a plurality of encoder heads 15 disposed in the X-axis direction and are disposed on the +X side of the terminating optical element 12 (liquid immersion member 3), and a linear encoder 6D that includes a plurality of encoder heads 15 disposed in the Y-axis direction and are disposed on the +Y side of the terminating optical element 12 (liquid immersion member 3).

In the present embodiment, the linear encoders 6A and 6C measure the position of the substrate stage 2P in the Y-axis direction using the Y scales 26 and 27. The linear encoders 6B and 6D measure the position of the substrate stage 2P in the X-axis direction using the X scales 28 and 29.

The linear encoders 6A to 6D (encoder head 15) are disposed at positions that the surface of the scale member 22 can face. The scale member 22 can move to the positions of the linear encoders 6A to 6D facing the encoder head 15. The encoder head 15 irradiates a measurement region with measurement light, which is emitted from the irradiation apparatus, to detect the grating of the scale member 22 disposed in the measurement region. At least some of the measurement light beams from the irradiation apparatus that have been irradiated to the scale member 22 are reflected by the scale member 22. At least some of the measurement light beams reflected by the scale member 22 are received by the light receiving apparatus. The encoder system 6 measures the position of the scale member 22 (substrate stage 2P), for example, in the X-axis, Y-axis, and θZ direction on the basis of the light receiving results of the light receiving apparatuses of the plurality of encoder heads 15 provided in the respective linear encoders 6A to 6D.

In the present embodiment, at least a part of the linear encoder 6D is disposed between the first and second substrate replacement positions CP1 and CP2 and the exposure position EP. The linear encoder 6D measures the position of the substrate stage 2P between the first and second substrate replacement positions CP1 and CP2 and the exposure position EP. In other words, the linear encoder 6D measures the position of the scale member (substrate stage 2P) disposed between the first and second substrate replacement positions CP1 and CP2 and the exposure position EP.

In the present embodiment, the linear encoders 6A to 6C are disposed closer to the −Y side than the detection region AF is. That is, in the present embodiment, the linear encoders 6A to 6C are farther from the first and second substrate replacement positions CP1 and CP2 than the detection regions AF and ALA to ALE.

Figure 5:
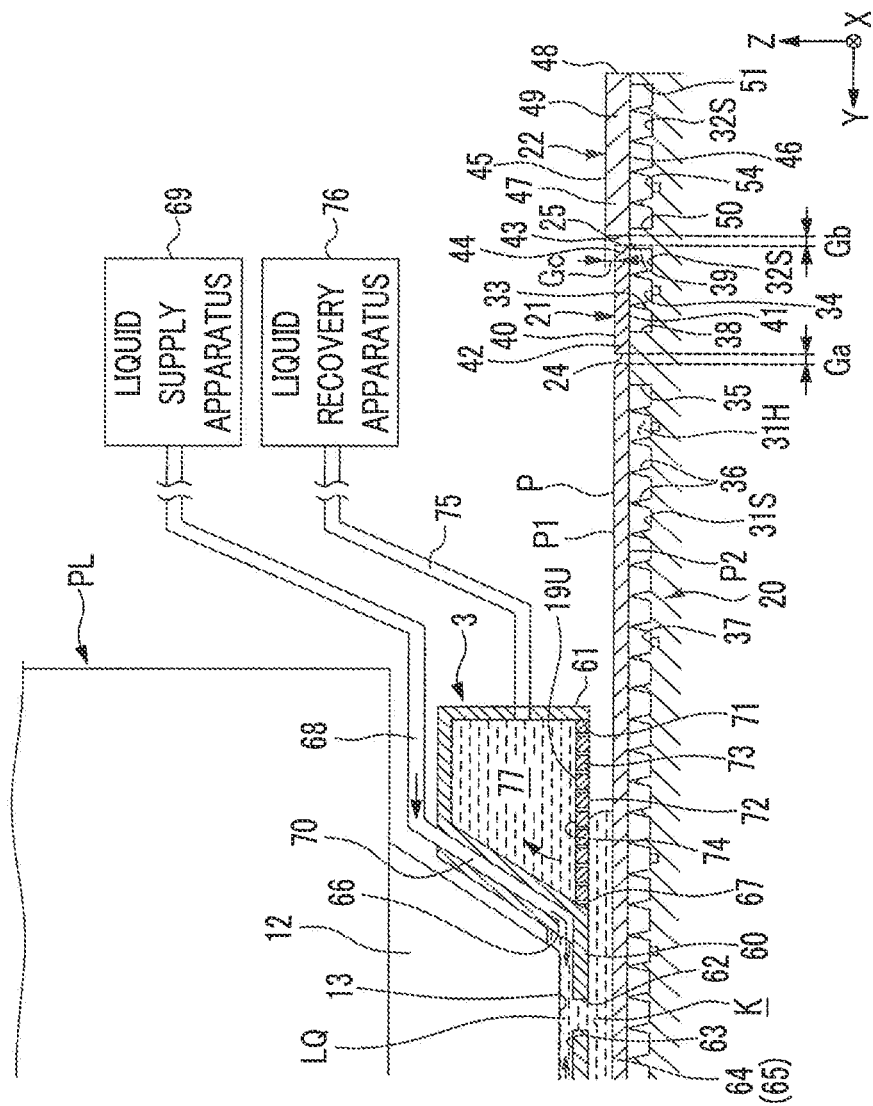
FIG. 5 is a side sectional view showing an example of a liquid immersion member and a substrate stage of the present embodiment.

FIG. 5 is a side sectional view showing an example of the liquid immersion member 3 and the substrate stage 2P according to the present embodiment. In addition, in FIG. 5, the substrate P is disposed in the projection region PR (position facing the terminating optical element 12 and the liquid immersion member 3). In the exposure apparatus EX, it is possible to dispose the measuring stage 2C in the projection region PR, or it is possible to dispose the substrate stage 2P and the measuring stage 2C in the projection region PR.

In the present embodiment, the substrate P has a top surface (upper surface P1) and a bottom surface (lower surface P2) facing in the opposite direction to the top surface. In the present embodiment, the upper surface P1 is substantially flat. In the present embodiment, the first holding member 20 holds the lower surface P2 of the substrate P so that the upper surface P1 of the substrate P and the XY plane are substantially parallel to each other.

In addition, at least a part of the upper surface P1 of substrate P may not be flat. For example, at least one of a recessed portion, a protruding portion, and a curved surface may be included. In addition, the substrate P may be disposed in the exposure apparatus EX such that at least a part of the upper surface P1 is not parallel to the XY plane.

In the present embodiment, the first holding member 20 includes a suction mechanism, such as a pin-chuck mechanism. The first holding member 20 includes a peripheral wall portion 35 disposed on a support surface 31S of the substrate stage 2P, a support portion 36 disposed on the support surface 31S on the inside of the peripheral wall portion 35, and a suction port 37 disposed on the support surface 31S. The lower surface P2 of the substrate P can face the peripheral wall portion 35. The support portion 36 includes a plurality of pin members in contact with the lower surface P2 of the substrate P. The suction port 37 is connected to a fluid suction device so as to suction the fluid. The fluid suction device is controlled by the control device 4.

In the present embodiment, the upper surface of the peripheral wall portion 35 can face the lower surface P2 of the substrate P. A negative pressure space can be formed in at least a part of the region between the peripheral wall portion 35 and the lower surface P2 of the substrate P. The control device 4 can make a space 31H, which is formed by the peripheral wall portion 35, the lower surface P2 of the substrate P, and the support surface 31S, have negative pressure by performing a suction operation through the suction port 37 in a state where the lower surface P2 of the substrate P and the upper surface of the peripheral wall portion 35 are in contact with each other. In this manner, the substrate P is held on the first holding member 20. In addition, the substrate P is released from the first holding member 20 when the suction operation of the suction port 37 is released.

In the present embodiment, the cover member 21 is a plate-shaped member. In the present embodiment, the cover member 21 has a top surface (upper surface 40) and a bottom surface (lower surface 41) facing in the opposite direction to the top surface. The upper surface 40 of the cover member 21 is substantially flat. The second holding member 23 holds the lower surface 41 of the cover member 21 so that the upper surface 40 of the cover member 21 is substantially parallel to the XY plane. In the present embodiment, at least a part of the upper surface 40 of the cover member 21 held on the second holding member 23 can face the emission surface 13 of the terminating optical element 12. In the present embodiment, the upper surface 40 of the cover member 21 includes an inner peripheral portion 42 including at least a part of the edge of the opening 24, and an outer peripheral portion 44 including at least a part of the edge of the outer periphery 43. In the present embodiment, the inner peripheral portion 42 is an annular (frame-shaped) portion along the edge of the opening 24, and the outer peripheral portion 44 is a portion that annularly (in a frame shape) surrounds the inner peripheral portion 42.

In the present embodiment, the upper surface 40 (inner peripheral portion 42) of the cover member 21 is disposed in at least a part of a surrounding of the upper surface P1 of the substrate P held on the first holding member 20. The upper surface 40 of the cover member 21 is disposed so as to annularly surround the upper surface P1 of the substrate P held on the first holding member 20. The upper surface 40 of the cover member 21 held on the second holding member 23 is adjacent to the upper surface P1 of the substrate P with a gap Ga interposed therebetween. The gap Ga includes a gap between the substrate P held on the first holding member 20 and the cover member 21 held on the second holding member 23.

In the present embodiment, the upper surface 40 of the cover member 21 held on the second holding member 23 is substantially parallel to the upper surface P1 of the substrate P held on the first holding member 20. The upper surface P1 of the substrate P held on the first holding member 20 and the upper surface 40 of the cover member 21 held on the second holding member 23 are disposed within substantially the same plane (are substantially flush with each other).

In addition, the cover member 21 may not be a plate-shaped member. For example, the cover member 21 may be a block-shaped member. In addition, at least a part of the upper surface 40 of the cover member 21 may not be flat. For example, at least one of a recessed portion, a protruding portion, and a curved surface may be included. In addition, at least a part of the upper surface 40 of the cover member 21 held on the second holding member 23 may be inclined with respect to the substrate P held on the first holding member 20.

In addition, the upper surface 40 of the cover member 21 held on the second holding member 23 may be discretely disposed at a surrounding of the upper surface P1 of the substrate P held on the first holding member 20. For example, the exposure apparatus EX may include a plurality of cover members 21, and the upper surfaces 40 of the plurality of cover members 21 may be disposed so as to surround the upper surface P1 of the substrate P held on the first holding member 20. In addition, the cover member 21 may be divided into a plurality of first members. For example, a plurality of first members may be held on the second holding member 23, and the upper surface 40 of the cover member 21 may be formed by the upper surfaces of the plurality of first members. In addition, the upper surface 40 of the cover member 21 held on the second holding member 23 may be disposed in only one place of a surrounding of the upper surface P1 of the substrate P held on the first holding member 20.

In addition, at least a part of the upper surface 40 of the cover member 21 held on the second holding member 23 may have a step difference for the upper surface P1 of the substrate P held on the first holding member 20. For example, at least a part of the upper surface 40 of the cover member 21 held on the second holding member 23 may be disposed above (+Z side) or below (−Z side) the upper surface P1 of the substrate P held on the first holding member 20.

In the present embodiment, the scale member 22 is a plate-shaped member. In the present embodiment, the scale member 22 has a top surface (upper surface 45) and a bottom surface (lower surface 46) facing in the opposite direction to the top surface. The upper surface 45 of the scale member 22 is substantially flat. The second holding member 23 holds the lower surface 46 of the scale member 22 so that the upper surface 45 of the scale member 22 is substantially parallel to the XY plane. In the present embodiment, the upper surface 45 of the scale member 22 includes an inner peripheral portion 47 including at least a part of the edge of the opening 25 and an outer peripheral portion 49 including at least a part of the edge of the outer periphery 48. In the present embodiment, the inner peripheral portion 47 is an annular (frame-shaped) portion along the edge of the opening 25, and the outer peripheral portion 49 is a portion that annularly (in a frame shape) surrounds the inner peripheral portion 47.

In the present embodiment, the upper surface 45 (inner peripheral portion 47) of the scale member 22 is disposed in at least a part of a surrounding of the upper surface 40 (outer peripheral portion 44) of the cover member 21 held on the second holding member 23. The upper surface 45 of the scale member 22 is disposed so as to annularly surround the upper surface 40 of the cover member 21 held on the second holding member 23. The upper surface 45 of the scale member 22 held on the second holding member 23 is adjacent to the upper surface 40 of the cover member 21 held on the second holding member 23 with a gap Gb interposed therebetween. The gap Gb includes a gap between the cover member 21 held on the second holding member 23 and the scale member 22 held on the second holding member 23.

In the present embodiment, the upper surface 45 of the scale member 22 held on the second holding member 23 is substantially parallel to the upper surface 40 of the cover member 21 held on the second holding member 23. The upper surface 45 of the scale member 22 held on the second holding member 23 has a step difference Gc for the upper surface 40 of the cover member 21 held on the second holding member 23. In the present embodiment, at least a part of the upper surface 45 of the scale member 22 held on the second holding member 23 is disposed above (+Z side) the upper surface 40 of the cover member 21 held on the second holding member 23. The inner peripheral portion 47 of the upper surface 45 of the scale member 22 held on the second holding member 23 is disposed above the outer peripheral portion 44 of the upper surface 40 of the cover member 21 held on the second holding member 23. The inner peripheral portion 47 of the upper surface 45 of the scale member 22 is a portion that annularly surrounds the outer peripheral portion 44 of the upper surface 40 of the cover member 21 held on the second holding member 23. In the present embodiment, at any position of the outer periphery of the upper surface 40 of the cover member 21 held on the second holding member 23, the inner peripheral portion 47 of the upper surface 45 of the scale member 22 is disposed above the outer periphery of the upper surface 40 of the cover member 21.

In addition, the scale member 22 may not be a plate-shaped member. For example, the scale member 22 may be a block-shaped member. In addition, at least a part of the upper surface 45 of the scale member 22 may not be flat. For example, at least one of a recessed portion, a protruding portion, and a curved surface may be included. In addition, at least a part of the upper surface 45 of the scale member 22 held on the second holding member 23 may be inclined with respect to the cover member 21 held on the second holding member 23.

In addition, the upper surface 45 of the scale member 22 held on the second holding member 23 may be discretely disposed at a surrounding of the upper surface 40 of the cover member 21 held on the second holding member 23. For example, the exposure apparatus EX may include a plurality of scale members 22, and the upper surfaces 45 of the plurality of scale members 22 may be disposed so as to surround the upper surface 40 of the cover member 21 held on the second holding member 23. In addition, the scale member 22 may be divided into a plurality of second members. For example, a plurality of second members may be held on the second holding member 23, and the upper surface 45 of the scale member 22 may include the upper surfaces of the plurality of second members. For example, a plurality of second members may include one or both of a member having an X scale and a member having a Y scale. In addition, the upper surface 45 of the scale member 22 held on the second holding member 23 may be disposed in only one place of a surrounding of the upper surface 40 of the cover member 21 held on the second holding member 23.

In addition, at least a part of the upper surface 45 of the scale member 22 held on the second holding member 23 may be disposed below (−Z side) the upper surface 40 of the cover member 21 held on the second holding member 23. In addition, the upper surface 45 of the scale member 22 held on the second holding member 23 and the upper surface 40 of the cover member 21 held on the second holding member 23 may be disposed within substantially the same plane (are substantially flush with each other). In addition, for example, the scale member 22 and the cover member 21 may be integrally formed or may be bonded to each other, and the upper surface 45 of the scale member 22 held on the second holding member 23 and the upper surface 40 of the cover member 21 held on the second holding member 23 may not substantially have the gap Gb therebetween. A measuring member or a measuring device different from the scale member 22 may be disposed on the substrate stage 2P.

For example, the scale member 22 may be disposed at a position that the substrate stage 2P can face, and an encoder head (measuring device, measuring member) that detects light through the scale member 22 may be disposed on the substrate stage 2P that can face the scale member 22. In addition, the exposure apparatus EX may not include the scale member 22, and may not include the encoder system 6.

In the present embodiment, the second holding member 23 includes a suction mechanism, such as a pin-chuck mechanism. The second holding member 23 includes a peripheral wall portion 38 disposed on a support surface 32S of the substrate stage 2P so as to surround the peripheral wall portion 35, a peripheral wall portion 39 disposed on the support surface 32S so as to surround the peripheral wall portion 38, a support portion 33 disposed on the support surface 32S between the peripheral wall portions 38 and 39, and a suction port 34 disposed on the support surface 32S. The lower surface 41 of the cover member 21 can face the peripheral wall portion 38 and the peripheral wall portion 39. The support portion 33 includes a plurality of pin members in contact with the lower surface 41 of the cover member 21. The suction port 34 is connected to a fluid suction device so as to suction the fluid. The fluid suction device is controlled by the control device 4.

In the present embodiment, the upper surface of the peripheral wall portion 38 and the upper surface of the peripheral wall portion 39 can face the lower surface 41 of the cover member 21. A negative pressure space can be formed in at least a part of the region between the peripheral wall portions 38 and 39 and the lower surface 41 of the cover member 21. The control device 4 can make a space, which is formed by the peripheral wall portions 38 and 39, the lower surface 41 of the cover member 21, and the support surface 32S, have negative pressure by performing a suction operation through the suction port 34 in a state where the upper surface of the peripheral wall portion 38 and the upper surface of the peripheral wall portion 39 are in contact with the lower surface 41 of the cover member 21. In this manner, the cover member 21 is held on the second holding member 23. In addition, the cover member 21 is released from the second holding member 23 when the suction operation of the suction port 34 is released.

In the present embodiment, the second holding member 23 includes a peripheral wall portion 50 disposed on the support surface 32S of the substrate stage 2P so as to surround the peripheral wall portion 39, a peripheral wall portion 51 disposed on the support surface 32S so as to surround the peripheral wall portion 50, a support portion 52 disposed on the support surface 32S between the peripheral wall portions 50 and 51, and a suction port 54 disposed on the support surface 32S. The lower surface 46 of the scale member 22 can face the peripheral wall portions 50 and 51. The support portion 52 includes a plurality of pin members in contact with the lower surface 46 of the scale member 22. The suction port 54 is connected to a fluid suction device so as to suction the fluid. The fluid suction device is controlled by the control device 4.

In the present embodiment, the upper surface of the peripheral wall portion 50 and the upper surface of the peripheral wall portion 51 can face the lower surface 46 of the scale member 22. A negative pressure space can be formed in at least a part of the region between the peripheral wall portions 50 and 51 and the lower surface 46 of the scale member 22. The control device 4 can make a space, which is formed by the peripheral wall portions 50 and 51, the lower surface 46 of the scale member 22, and the support surface 32S, have negative pressure by performing a suction operation through the suction port 54 in a state where the upper surface of the peripheral wall portion 50 and the upper surface of the peripheral wall portion 51 are in contact with the lower surface 46 of the scale member 22. In this manner, the scale member 22 is held on the second holding member 23. In addition, the scale member 22 is released from the second holding member 23 when the suction operation of the suction port 54 is released.

In addition, although the cover member 21 and the scale member 22 are releasable from the substrate stage 2P in the present embodiment, at least one of the cover member 21 and the scale member 22 may not be releasable from the substrate stage 2P. For example, in the substrate stage 2P, the cover member 21 and the scale member 22 may not be releasable from the substrate stage 2P, and the second holding member 23 may not be included.

In addition, although the second holding member 23 holds the cover member 21 and the scale member 22 in the present embodiment, the second holding member 23 may hold one of the cover member 21 and the scale member 22 and may not hold the other one of the cover member 21 and the scale member 22. For example, in the substrate stage 2P, one of the cover member 21 and the scale member 22 may be held by the second holding member 23, and the other one of the cover member 21 and the scale member 22 may be held by a third holding member other than the second holding member 23.

In addition, although the cover member 21 is a different member from the scale member 22 in the present embodiment, the cover member 21 may be a member formed integrally with the scale member 22 or may be a member bonded to the scale member 22. In addition, although the cover member 21 can be detached from the second holding member 23 independently of the scale member 22 in the present embodiment, the cover member 21 and the scale member 22 may be integrally formed or may be bonded to each other so that the cover member 21 can be detached from the second holding member 23 together with the scale member 22, for example.

Figure 6:
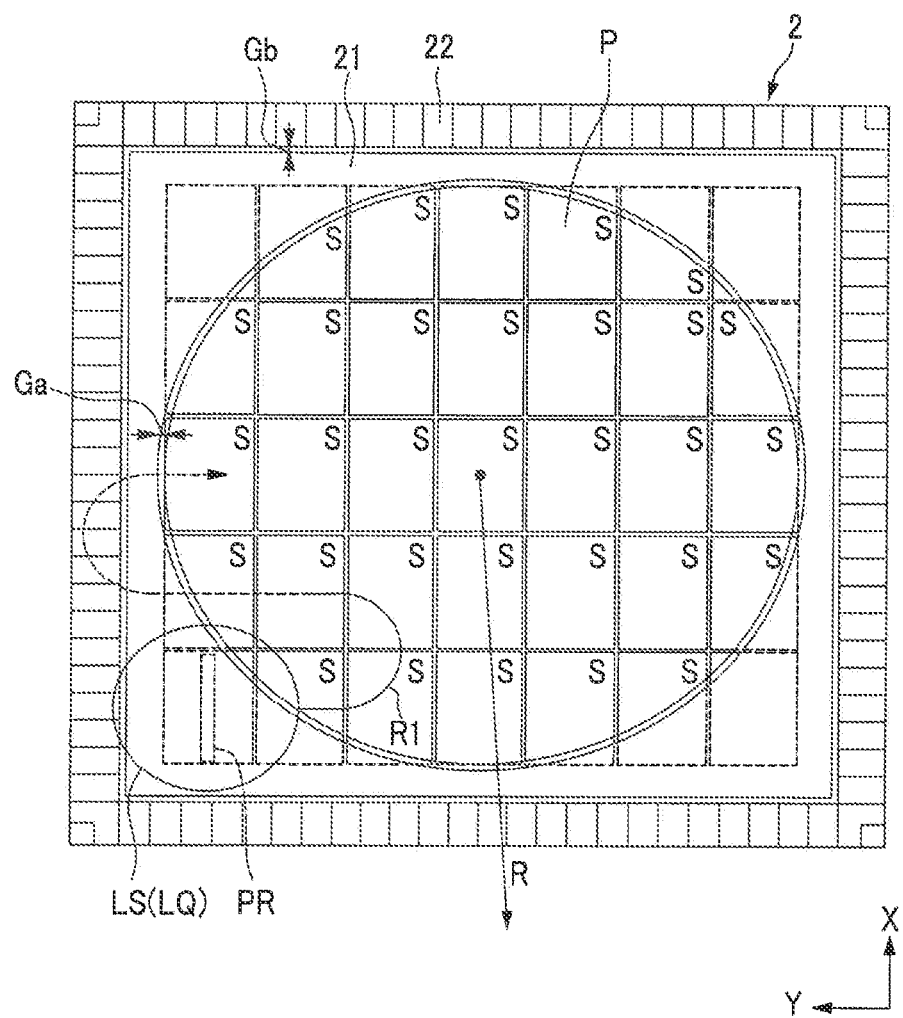
FIG. 6 is a diagram showing an example of a substrate held on a first holding member of the present embodiment.

FIG. 6 is a diagram showing an example of the substrate P held on the first holding member 20 (substrate stage 2P). In the present embodiment, a plurality of shot regions S, which are regions to be exposed on the substrate P, are disposed in a matrix. The control device 4 sequentially exposes a plurality of shot regions S set on the substrate P. In addition, in FIG. 6, for convenience of explanation, the immersion space LS is schematically shown such that the shape of the immersion space LS projected onto the XY plane is a circle. However, there is no limitation on the shape of the immersion space LS.

As shown in FIG. 4, the liquid immersion member 3 of the present embodiment includes a facing portion 60 at least a part of which faces the emission surface 13 of the terminating optical element 12 and a main body portion 61 at least a part of which is disposed at a surrounding of the terminating optical element 12. The facing portion 60 includes a hole (opening) 62 at a position facing the emission surface 13. The facing portion 60 includes an upper surface 63 at least a part of which faces the emission surface 13 with a gap interposed therebetween and a lower surface 64 that the substrate P (object) can face. The hole 62 is formed so as to connect the upper surface 63 and the lower surface 64 to each other. The upper surface 63 is disposed at a surrounding of the upper end of the hole 62, and the lower surface 64 is disposed at a surrounding of the lower end of the hole 62.

The exposure light EL emitted from the emission surface 13 can pass through the hole 62 to irradiate the substrate P.

In the present embodiment, each of the upper surface 63 and the lower surface 64 is disposed at a surrounding of the optical path K. In the present embodiment, the lower surface 64 is a flat surface. The liquid LQ can be held between the lower surface 64 and the substrates P (object). In the following explanation, the lower surface 64 will be appropriately referred to as a holding surface 65.

In addition, the liquid immersion member 3 includes a supply port 66 through which the liquid LQ can be supplied and a recovery port 67 through which the liquid LQ can be recovered. The liquid LQ is supplied through the supply port 66, for example, at the time of exposure of the substrate P. The liquid LQ is recovered through the recovery port 67, for example, at the time of exposure of the substrate P. In addition, it is also possible to supply the liquid LQ through the supply port 66 in one or both of exposure and non-exposure of the substrate P. In addition, it is also possible to recover the liquid LQ through the recovery port 67 in one or both of exposure and non-exposure of the substrate P.

The supply port 66 is disposed so as to face the optical path K near the optical path K of the exposure light EL emitted from the emission surface 13. In addition, the supply port 66 may face one or both of a space between the emission surface 13 and the hole 62 and the side surface of the terminating optical element 12. In the present embodiment, the liquid LQ is supplied to the space between the upper surface 63 and the emission surface 13 through the supply port 66. The liquid LQ supplied through the supply port 66 flows through the space between the upper surface 63 and the emission surface 13 and is then supplied onto the substrate P (object) through the hole 62. The supply port 66 is connected to a liquid supply apparatus 69 through a flow path 68. The liquid supply apparatus 69 can deliver the liquid LQ that is clean and temperature-adjusted. The flow path 68 includes a supply flow path 70 formed inside the liquid immersion member 3 and a flow path formed by a supply pipe connecting the supply flow path 70 and the liquid supply apparatus 69 to each other. The liquid LQ delivered from the liquid supply apparatus 69 is supplied to the supply port 66 through the flow path 68. The liquid LQ is supplied through the supply port 66 at least during the exposure of the substrate P.

At least some of the liquid LQ on the object facing the lower surface 64 of the liquid immersion member 3 can be recovered through the recovery port 67. The recovery port 67 is disposed in at least a part of a surrounding of the hole 62 through which the exposure light EL passes. In the present embodiment, the recovery port 67 is disposed in at least a part of a surrounding of the holding surface 65. The recovery port 67 is disposed at a predetermined position of the liquid immersion member 3 facing the surface of the object. The substrate P faces the recovery port 67 at least during the exposure of the substrate P. During the exposure of the substrate P, the liquid LQ on the substrate P is recovered through the recovery port 67.

In the present embodiment, the main body portion 61 includes an opening 71 facing the substrate P (object). The opening 71 is disposed in at least a part of a surrounding of the holding surface 65. In the present embodiment, the liquid immersion member 3 includes a porous member 72 disposed in the opening 71. In the present embodiment, the porous member 72 is a plate-shaped member including a plurality of holes (openings or pores). In addition, a mesh filter, which is a porous member in which a number of small holes are formed in a mesh form, may be disposed in the opening 71.

In the present embodiment, the porous member 72 includes a lower surface 73 that the substrate P (object) can face, an upper surface 74 facing in the opposite direction to the lower surface 73, and a plurality of holes connecting the upper surface 74 and the lower surface 73 to each other. The lower surface 73 is disposed in at least a part of a surrounding of the holding surface 65. In the present embodiment, at least a part of the lower surface 64 of the liquid immersion member 3 includes the holding surface 65 and the lower surface 73.

In the present embodiment, the recovery ports 67 include the holes of the porous member 72. In the present embodiment, the liquid LQ on the substrate P (object) is recovered through the holes (recovery ports 67) of the porous member 72. In addition, the liquid immersion member 3 may not include the porous member 72.

The recovery port 67 is connected to a liquid recovery apparatus 76 through a flow path 75. The liquid recovery apparatus 76 can connect the recovery port 67 to a vacuum system in order to suction the liquid LQ through the recovery port 67. The flow path 75 includes a recovery flow path 77 formed inside the liquid immersion member 3 and a flow path formed by a recovery pipe connecting the recovery flow path 77 and the liquid recovery apparatus 76 to each other. The liquid LQ recovered through the recovery port 67 is recovered to the liquid recovery apparatus 76 through the flow path 75.

In the present embodiment, the control device 4 can form the immersion space LS with the liquid LQ between the terminating optical element 12 and the liquid immersion member 3 on one side and the object on the other side by performing an operation of recovering the liquid LQ through the recovery port 67 in parallel with an operation of supplying the liquid LQ through the supply port 66.

In addition, for example, a liquid immersion member (nozzle member) disclosed in the specification of U.S. Patent Application Publication No. 2007/0132976 and the specification of European Patent Application Publication No. 1768170 can be used as the liquid immersion member 3.

When the exposure apparatus EX of the present embodiment exposes the shot region S of the substrate P, the terminating optical element 12 and the liquid immersion member 3 face the substrate P, and the immersion space LS is formed such that the optical path K of the exposure light EL between the terminating optical element 12 and the substrate P is filled with the liquid LQ. In the present embodiment, when the exposure apparatus EX sequentially exposes a plurality of shot regions S of the substrate P, the substrate stage 2P is moved into the XY plane in a state where the immersion space LS is formed by the liquid LQ between a first portion including the terminating optical element 12 and the liquid immersion member 3 and a second surface facing the first portion. The second surface includes one or both of the upper surface P1 of the substrate P and an upper surface 2U of the substrate stage 2P. The control device 4 performs the exposure of the substrate P while moving the substrate stage 2P in a state where the immersion space LS is formed by the liquid LQ between the first portion including the terminating optical element 12 and the liquid immersion member 3 and the second surface facing the first portion.

In the present embodiment, in order to expose a first shot region S of the plurality of shot regions S on the substrate P, the control device 4 moves the first shot region S1 to the exposure start position. The control device 4 irradiates the first shot region S1 with the exposure light EL while moving the first shot region S1 (substrate P) in the Y-axis direction with respect to the projection region PR of the projection optical system PL in a state where the immersion space LS is formed.

In the present embodiment, in order to expose the next second shot region S2 after the end of the exposure of the first shot region S1, the control device 4 moves the second shot region S2 to the exposure start position by moving the substrate P in the X-axis direction (or in a direction inclined with respect to the X-axis direction within the XY plane) in a state where the immersion space LS is formed. The control device 4 exposes the second shot region S2 in the same manner as for the first shot region S1.

In the present embodiment, the control device 4 sequentially exposes a plurality of shot regions S on the substrate P through the projection optical system PL and the liquid LQ in the immersion space LS while repeating a scanning exposure operation and a stepping operation. The exposure light EL is sequentially irradiated to the plurality of shot regions S of the substrate P. In addition, the scanning exposure operation includes an operation of irradiating the shot region S with the exposure light EL while moving the shot region S in the Y-axis direction with respect to the projection region PR. In addition, the stepping operation includes an operation of moving the next shot region S to the exposure start position after the end of the exposure of the present shot region S.

In the present embodiment, the control device 4 sequentially exposes a plurality of shot regions S of the substrate P with the exposure light EL through the liquid LQ by irradiating the projection region PR with the exposure light EL while moving the substrate stage 2P so that the projection region PR of the projection optical system PL and the substrate P move relative to each other along the movement trajectory indicated by arrow R1 in FIG. 6. In the present embodiment, the simulator 105 shown in FIG. 1 supplies movement information for controlling the movement of the substrate stage 2P to the host controller 104. The host controller 104 supplies the movement information supplied from the simulator 105 to the control device 4 of the exposure apparatus EX. In the present embodiment, the exposure apparatus EX controls the movement of the substrate stage 2P when exposing each shot region of the substrate P on the basis of the movement information supplied from the host controller 104.

Generally, a liquid may be separated from the immersion space, for example, due to the relative movement of the liquid immersion member (terminating optical element) and the substrate stage. When a liquid such as liquid droplets separated from the immersion space (hereinafter, referred to as a separated liquid) remains on the surface of the object, such as a substrate, the remaining liquid may cause the occurrence of stain (so-called watermark when the liquid LQ is pure water) after being dried. For example, the separated liquid remaining on the substrate may cause exposure failures.

In addition, the separated liquid may flow to the outside of the substrate and have an adverse effect on a member disposed outside the substrate. For example, the separated liquid may reduce the accuracy of the measurement using a measuring member by wetting the measuring member disposed outside the substrate. As a result, exposure failure may occur. In addition, air bubbles may be mixed into (generated in) the liquid that forms a liquid space, for example, due to the relative movement of the liquid immersion member and the substrate stage. For example, when the immersion space crosses the gap (when the immersion space passes above the gap or when the immersion liquid bridges over the gap), air bubbles may be mixed. The air bubbles mixed into the immersion space may cause exposure failures. For example, when air bubbles mixed into the immersion space adhere to the surface of the substrate P and a portion, to which the air bubbles have adhered, of the surface of the substrate P is irradiated with the exposure light EL, exposure failure may occur.

In the present embodiment, the simulator 105 calculates liquid information regarding the liquid LQ on the object facing the terminating optical element 12 that emits the exposure light EL. For example, the liquid information calculated by the simulator 105 includes information regarding the movement of the liquid LQ when moving on the object facing the terminating optical element 12 that emits the exposure light EL. In the present embodiment, the simulator 105 estimates the movement of the liquid LQ on an object facing the terminating optical element 12 when moving the object. The information calculated by the simulator 105 can be used to suppress the occurrence of exposure failure, for example. In the present embodiment, since the exposure apparatus EX performs an exposure process on the basis of the information calculated by the simulator 105, it is possible to suppress the occurrence of exposure failure. As a result, the device manufacturing system 100 of the present embodiment can suppress the generation of defective devices.

Figure 7:
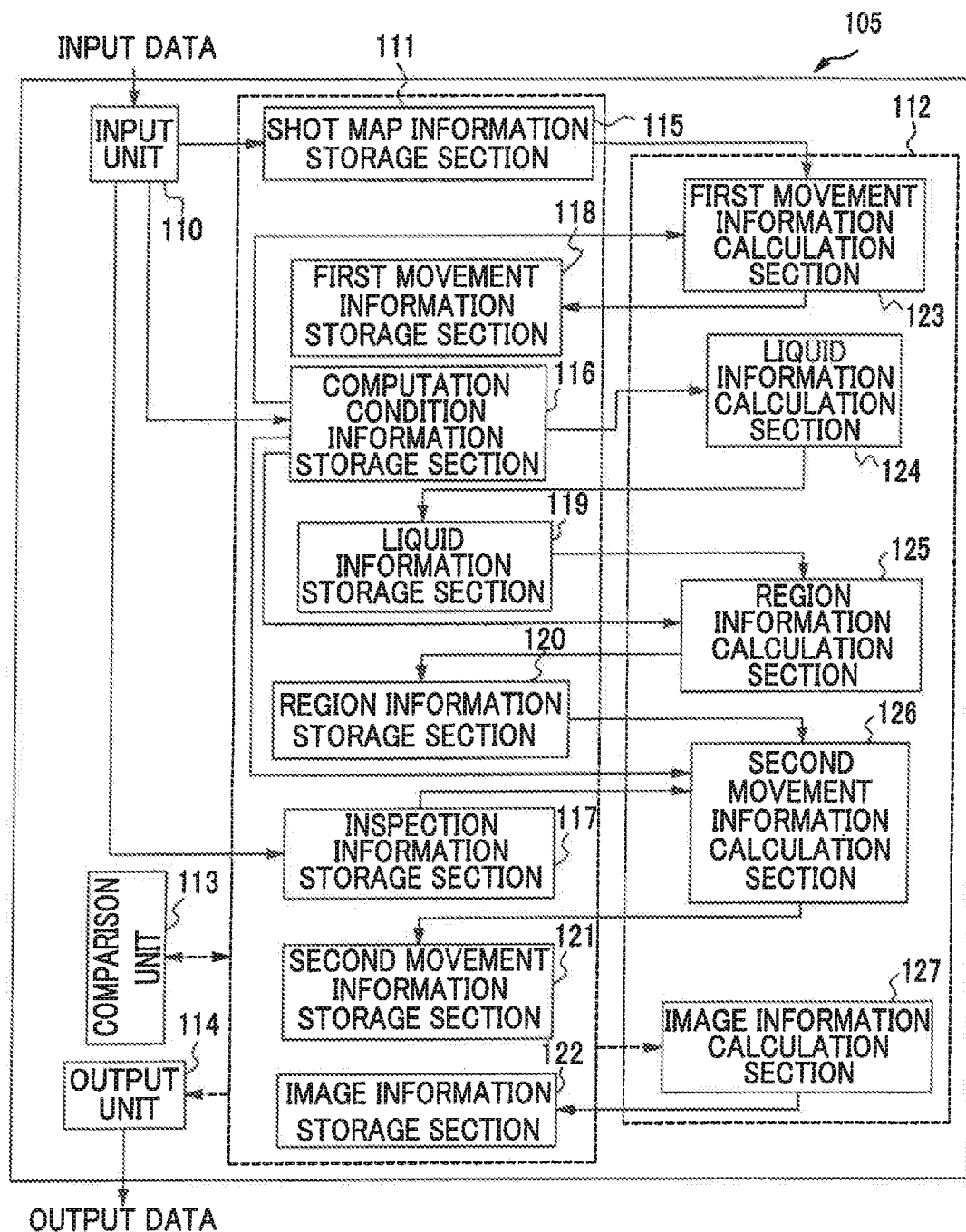
FIG. 7 is a block diagram showing the functional configuration of a simulator of the present embodiment.

FIG. 7 is a diagram showing an example of the functional configuration of the simulator 105 of the present embodiment. The simulator 105 shown in FIG. 7 includes functional units of an input unit 110, an information storage unit 111, an information calculation unit 112, a comparison unit 113, an output unit 114, and the like. In the present embodiment, the input unit 110 receives an input of information (input data) from the outside of the simulator 105. In the present embodiment, the information storage unit 111 stores the information input from the outside of the simulator 105, information calculated by the information calculation unit 112, and the like. In the present embodiment, the information calculation unit 112 calculates various kinds of information on the basis of the information stored in the information storage unit 111 and the like. In the present embodiment, the comparison unit 113 compares the information stored in the information storage unit 111. In the present embodiment, the output unit 114 outputs the information stored in the information storage unit 111 to the outside of the simulator 105.

In addition, some of the functional units of the simulator 105 may be omitted. For example, when a comparison operation to be described later is not performed, the comparison unit 113 may not be provided. In addition, two or more of the functional units of the simulator 105 may be integrated.

In the present embodiment, the input data includes either or both of information input from the host controller 104 shown in FIG. 1 and information input from the operator. In addition, information from the outside of the simulator 105 may not be input to the simulator 105. In this case, the input unit 110 may be omitted. For example, the simulator 105 may hold the information required for the information calculation of the simulator 105 inside the simulator 105.

In the present embodiment, the information input to the input unit 110 from the host controller 104 includes either or both of apparatus information, which is acquired from the substrate processing apparatus 102 by the host controller 104, and inspection information, which is acquired from the inspection apparatus 103 and the like by the host controller 104. The apparatus information includes information indicating the operating conditions of the substrate processing apparatus 102, for example. The operating conditions of the substrate processing apparatus 102 include the operating conditions of the substrate stage 2P of the exposure apparatus EX. The operating conditions of the substrate stage 2P include at least one item of the condition (movable range) of a position to which the substrate stage 2P can be moved by the substrate stage 2P of the exposure apparatus EX, the condition of the speed of the movement of the substrate P by the substrate stage 2P, and the condition of the acceleration of the movement of the substrate P by the substrate stage 2P. The inspection information includes a result of the detection of the liquid remaining on the substrate P by the first detection system 7 of the exposure apparatus EX, for example. In addition, the inspection information includes information indicating the result of the exposure process and the like as a result of the inspection of the exposed substrate P by the inspection apparatus 103, for example.

In the present embodiment, the information input from the operator includes information indicating the exposure conditions designated by the operator. The exposure conditions designated by the operator include shot map information indicating the arrangement (distribution) of the shot region S in the substrate P, for example. The shot map information includes one or both of the position (coordinates) and the size of each of the plurality of shot regions S, for example. Moreover, in addition to the shot map information, conditions of the scanning of the substrate P by the exposure apparatus EX may be input as the exposure conditions designated by the operator. The scanning conditions include the scanning speed for each shot region, for example. In addition, a scanning direction for each shot region may be included as the scanning conditions. In addition, as the scanning conditions, at least one of the range (upper limit speed) of the moving speed of the substrate stage 2P and the range (upper limit acceleration) of the acceleration of the substrate stage 2P may be included. In addition, as the exposure conditions, at least either information regarding the liquid LQ or information regarding the substrate P may be included. The information regarding the liquid LQ includes either or both of information indicating the type (composition) of the liquid LQ and information indicating the physical properties such as the viscosity of the liquid LQ, for example. The information regarding the substrate P includes information of the contact angle of the surface (resist surface or top-coat surface) of the substrate P with respect to the liquid LQ, for example.

In addition, at least some of the information described as the information input from the operator may be held in the exposure apparatus EX, and may be input from the control device 4 of the exposure apparatus EX to the input unit 110 through the host controller 104 of the device manufacturing system 100. In addition, at least some of the information described as the information input from the operator may be held in the host controller 104 of the device manufacturing system 100, and may be input from the host controller 104 to the input unit 110. For example, the operator may input at least some of the exposure condition to the host controller 104, and the host controller 104 may supply at least some of the information input from the operator to the simulator 105. In addition, in the device manufacturing system 100, the reference value, recommended value, initial value, and the like of the exposure conditions are set in advance. Therefore, for the exposure conditions of items that are not designated by the operator, the simulator 105 can use the above-described values set in advance.

The information storage unit 111 of the present embodiment stores (holds) the information input to the input unit 110. The information storage unit 111 of the present embodiment includes functional sections of a shot map information storage section 115, a computation condition information storage section 116, an inspection information storage section 117, and the like. The shot map information storage section 115 of the present embodiment stores shot map information, which indicates the arrangement of the shot region S in the substrate P, of the information input to the input unit 110. The computation condition information storage section 116 of the present embodiment stores information indicating the computation conditions required when the information calculation unit 112 calculates information. The information stored in the computation condition information storage section 116 includes either or both of apparatus information indicating the operating conditions of the substrate processing apparatus 102 and information indicating the exposure conditions, for example. The inspection information storage section 117 stores inspection information, which indicates the result of the exposure process, of the information input to the input unit 110. When the inspection information is not used in the information calculation unit 112, the inspection information storage section 117 may not be provided.

In addition, the information storage unit 111 of the present embodiment stores information indicating the calculation result of the information calculation unit 112. The information storage unit 111 of the present embodiment includes functional sections of a first movement information storage section 118, a liquid information storage section 119, a region information storage section 120, a second movement information storage section 121, an image information storage section 122, and the like.

The information calculation unit 112 of the present embodiment includes functional sections of a first movement information calculation section 123, a liquid information calculation section 124, a region information calculation section 125, a second movement information calculation section 126, an image information calculation section 127, and the like.

In the present embodiment, the first movement information calculation section 123 calculates first movement information for controlling the movement of the substrate stage 2P, which holds the substrate P, on the basis of the shot map information and the computation condition information (exposure conditions and the like). In the present embodiment, the first movement information includes at least one of the position information, speed information, and acceleration information of the substrate stage 2P on which the substrate P is disposed. For example, the position information indicates the position of the substrate stage 2P at each time in a period for which the substrate P is disposed on the substrate stage 2P. In the present embodiment, the position information also indicates the position of the substrate P disposed on the substrate stage 2P at each time. For example, the position of the substrate P at each time is the coordinates of the substrate P within the XY plane with respect to the reference position that is appropriately selected. The reference position may be the position of the optical axis of the projection optical system PL, for example. In addition, the speed information (acceleration information) indicates the speed of the substrate stage 2P at each time, and also indicates the speed (acceleration) of the substrate P disposed on the substrate stage 2P at each time.

FIGS. 8A to 8D and FIGS. 9A to 9D are diagrams showing examples of the immersion space LS and the movement path of the substrate P determined on the basis of the movement information. For example, as shown in FIGS. 8A to 8D, the first movement information calculation section 123 of the present embodiment determines a first movement path Tr1 of the substrate P so that a plurality of shot regions S specified in the shot map information pass through the projection region PR.

In the present embodiment, the first movement information calculation section 123 calculates the first movement information so that the movement of the substrate P satisfies the operating conditions specified in the apparatus information and the exposure conditions specified in the computation condition information. For example, the first movement information calculation section 123 calculates the first movement information so that the movement of the substrate P satisfies the operating conditions specified in the apparatus information and the exposure conditions specified in the computation condition information and the time until one substrate is unloaded from the substrate stage 2P after being loaded onto the substrate stage 2P is minimized in consideration of an appropriate margin. The first movement information calculation section 123 calculates the first movement information, for example, so that the throughput is maximized. The first movement information calculation section 123 stores the calculated first movement information in the first movement information storage section 118. In addition, when the first movement information is input from the input unit 110, the first movement information calculation section 123 may not be provided.

In addition, the position information is also obtained by integrating the speed indicated by the speed information with respect to time, by integrating the acceleration indicated by the acceleration information twice with respect to time, and the like. In addition, the speed information is also obtained by differentiating the position indicated by the position information with respect to time, by integrating the acceleration indicated by the acceleration information with respect to time, and the like. In addition, the acceleration information can also be obtained by differentiating the position indicated by the position information twice with respect to time, by differentiating the speed indicated by the speed information with respect to time, and the like.

The liquid information calculation section 124 of the present embodiment calculates the liquid information regarding the liquid LQ on the object facing the terminating optical element 12 that emits the exposure light EL.

Figure 10:
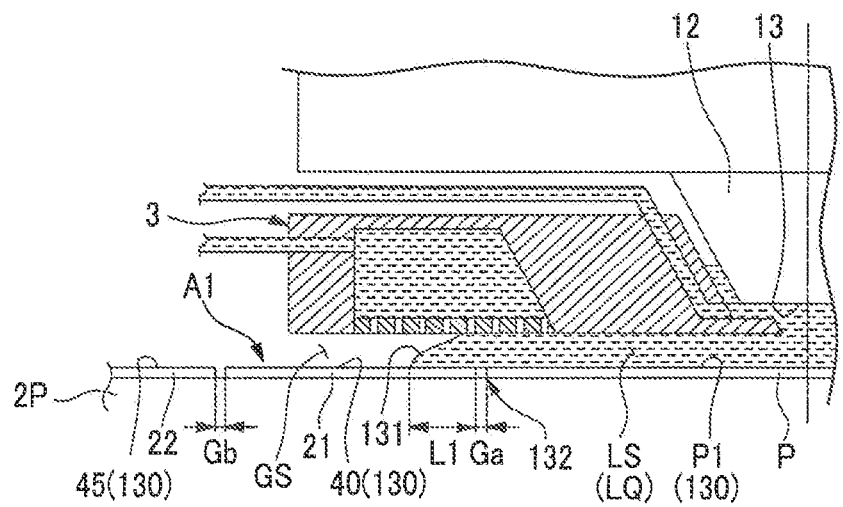
FIG. 10 is a diagram showing an example of the immersion space of the present embodiment.
Figure 11:
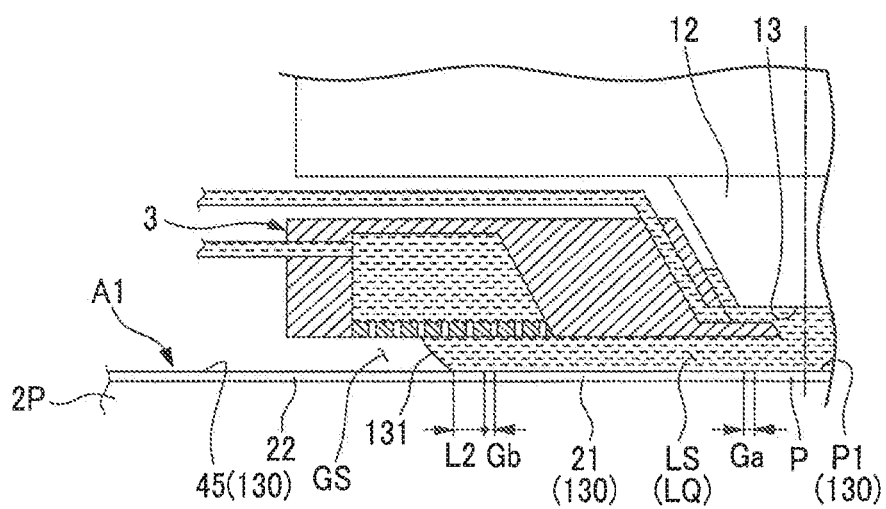
FIG. 11 is a diagram showing an example of the immersion space of the present embodiment.

FIGS. 10 and 11 are diagrams showing examples of the immersion space LS. As shown in FIGS. 10 and 11, in the present embodiment, the object facing the terminating optical element 12 includes at least one of the substrate P disposed on the substrate stage 2P, the cover member 21 disposed in at least a part of a surrounding of the substrate P, and the scale member 22 disposed in at least a part of a surrounding of the cover member 21. In the present embodiment, a region where the immersion space on the object facing the terminating optical element 12 can be formed is referred to as a facing region A1. In the present embodiment, the facing region A1 includes a surface (hereinafter, referred to as a facing surface 130) of the object facing the terminating optical element 12, a gap on the object, and the like. In the present embodiment, the facing surface 130 includes at least a part of the upper surface P1 of the substrate P held on the substrate stage 2P, the upper surface 40 of the cover member 21 held on the substrate stage 2P, and the upper surface 45 of the scale member 22 held on the substrate stage 2P. In the present embodiment, the gap on the object in the facing region A1 includes one or both of the gap Ga between the substrate P and the cover member 21 and the gap Gb between the cover member 21 and the scale member 22.

In the present embodiment, the liquid information includes a plurality of information items to be described below. However, the liquid information may not include at least one of the plurality of following information items. In addition, the simulator 105 may not calculate at least one of the plurality of information items of the liquid information. For example, at least one of the plurality of information items of the liquid information may be supplied from the outside (for example, the host controller 104) of the simulator 105 to the simulator 105.

The liquid information of the present embodiment includes interface position information indicating the position of an interface 131 between the immersion space LS and the outside (gas space GS). The interface position information includes information indicating the position of the interface 131 of the immersion space LS at each time in a period for which the immersion space LS is disposed on the facing region A1, for example. That is, the interface position information includes information indicating the movement (temporal change) of the interface 131 of the immersion space LS. For example, the interface position information includes information indicating the position of the interface 131 of the immersion space LS in the facing region A1. In addition, the liquid information may include interface deformation information indicating the deformation of the interface of the immersion space LS. For example, the interface deformation information may include information indicating the traceability (time delay and the like) of the movement of the immersion space LS with respect to the movement of the substrate stage 2P. The liquid information may not include the interface deformation information, for example, when the interface 131 of the immersion space LS is not substantially deformed.

In the present embodiment, the liquid information includes liquid contact information indicating a region, which is in contact with the liquid LQ (immersion space LS), of the facing region A1 (facing surface 130). The liquid contact information is information indicating a region of the facing surface 130 surrounded by the interface 131 of the immersion space LS, for example. In addition, in the present embodiment, the liquid information includes number-of-contacts information indicating the number of times each position of the facing surface 130 is in contact with the immersion space LS. For example, the number-of-contacts information includes information indicating the distribution of the number of contacts with the immersion space LS in the facing region A1. Incidentally, when a separated liquid is generated at the time of first contact with the immersion space LS in the facing region A1 (facing surface 130), the separated liquid may flow into the immersion space LS if the immersion space LS contacts again the position where the separated liquid has been generated. As a result, the remaining of separated liquid in the facing region A1 is suppressed. In other words, the number-of-contacts information can be used to estimate the remaining of separated liquid in the facing region A1 (facing surface 130), for example.

As shown in FIG. 10, the cover member 21 of the present embodiment is disposed so as to have the gap Ga for the substrate P held on the substrate stage 2P (the cover member 21 is disposed such that the gap Ga is formed between the cover member 21 and the substrate P). In the present embodiment, the immersion space LS may be disposed on the upper surface P1 of the substrate P and the upper surface 40 of the cover member 21 so as to cross the gap Ga (the immersion space LS may be disposed so as to cover a part of the upper surface P1 of the substrate P, a part of the upper surface 40 of the cover member 21, and a part of the gap Ga). In addition, in an example, "cross the gap Ga" includes a case where the immersion space LS is disposed so as to cover (1) part of the gap Ga, (2) part of the upper surface P1 of the substrate P, and (3) part of the upper surface 40 of the cover member 21. In another example, "cross the gap Ga" includes a case where the immersion space LS is disposed so as to cover (1) part of the gap Ga and (2) part of the upper surface P1 of the substrate P or a part of the upper surface 40 of the cover member 21.

In the present embodiment, the liquid information includes number-of-submergences information indicating the number of times the immersion space LS (number of times of submergence) crosses each position of the gap Ga (part of the gap Ga). For example, as shown in FIG. 10, assuming that a certain portion of the gap Ga is a first portion 132, the number of times of submergence of the first portion 132 is the number of times the immersion space LS is formed on the first portion 132 (for example, the number of times of submergence of the first portion 132 is the number of times the immersion space LS is disposed on a part of the edge of the upper surface P1 of the substrate P or on a part of the edge of the upper surface 40 of the cover member 21). For example, when the immersion space LS crosses the first portion 132, the number of times of submergence is counted. Then, the first portion 132 is disposed outside the immersion space LS. Then, when the immersion space LS crosses the first portion 132, the number of times of submergence is counted again. For example, the number of times of submergence of the first portion is 1 when the interface 131 has passed through the first portion 132 once. In addition, the number of times of submergence of the first portion is 2 when the interface 131 has passed through the first portion 132 three times. The number of times of submergence is calculated from the above-described interface position information, position information of the substrate stage 2P that is moved on the basis of the first movement information, and the like, for example.

Incidentally, when the immersion space LS crosses the gap Ga, the separation of the liquid from the immersion space LS, mixing of air bubbles into the immersion space LS, and the like may occur. In other words, the number-of-submergences information can be used as information for estimating one or both of the ease of generation of separated liquid at each position of the gap Ga and the ease of generation of air bubbles, for example. In addition, at a position of the gap Ga where the number of times of submergence is two or more, the probability of the generation of air bubbles in the immersion space LS or the amount of generated air bubbles may be increased, compared with a position where the number of times of submergence is 1. For example, at a position of the gap Ga where the number of times of submergence is 2, the amount of air bubbles generated in the immersion space LS may be larger than twice the amount of generated air bubbles at a position where the number of times of submergence is 1. In other words, the number-of-submergences information can be used as information for estimating one or both of the probability of the generation of air bubbles and the amount of generated air bubbles (expected value), for example.

In the present embodiment, the liquid information includes submergence time information indicating the time (submergence time) for which the immersion space LS crosses each position of the gap Ga. The submergence time is calculated from the above-described interface position information, position information of the substrate stage 2P that is moved on the basis of the first movement information, and the like, for example. For example, the time for which the immersion space LS crosses the first portion 132 of the gap Ga is a time from the point in time when the interface 131 of the immersion space LS has passed through the first portion 132 once to the point in time when the interface 131 has passed through the first portion 132 twice. In addition, when the immersion space LS crosses the first portion 132 multiple times (even number of times), the submergence time information may be information indicating the added submergence time or may be information indicating each submergence time separately.

Incidentally, a phenomenon (bridge phenomenon) in which the liquid LQ flows between the first side (for example, the substrate P side) and the second side (for example, the cover member 21 side), which form the gap Ga, due to the immersion space LS being formed on the gap Ga and the liquid LQ remains in the gap Ga may occur. The probability and the amount of occurrence of the bridge phenomenon increase as the number of times of submergence increases or the submergence time increases. In other words, the number-of-submergences information and the submergence time information can be used as information for estimating one or both of the probability and the amount of occurrence of the bridge phenomenon, for example.

In the present embodiment, the liquid information includes elapsed time information indicating the elapsed time after the immersion space LS passes through each position of the gap Ga. When the immersion space LS passes through a certain position of the gap Ga once, the interface 131 of the immersion space LS passes through the position twice. The elapsed time after the immersion space LS passes through each position of the gap Ga is calculated from the information indicating the movement of the interface 131 of the immersion space LS, for example. For example, the elapsed time until the immersion space LS crosses the first portion 132 after the immersion space LS passes through the first portion 132 of the gap Ga is a time from the point in time when the interface 131 of the immersion space LS has passed through the first portion 132 twice to the point in time when the interface 131 has passed through the first portion 132 three times.

Incidentally, a possibility that the bridge phenomenon described above will disappear increases as the elapsed time after the immersion space LS passes through the gap Ga increases. For example, when a liquid recovery portion to recover the liquid flowing to the gap Ga is provided in the substrate stage 2P, the liquid causing the bridge phenomenon may be removed by the liquid recovery portion. In other words, the information indicating the elapsed time after the immersion space LS passes through the gap Ga can be used as information for estimating at least one of whether or not the bridge phenomenon has occurred, the probability of occurrence of the bridge phenomenon, and the amount of residual liquid causing the bridge phenomenon, for example.

In the present embodiment, the liquid information includes interface distance information indicating a distance L1 from the gap Ga to the interface 131 of the immersion space LS in a state where the immersion space LS crosses the gap Ga. The interface distance information includes information regarding a distance from the gap Ga to the interface 131 of the immersion space LS on the outside of the substrate P in a state where the immersion space LS crosses the gap Ga when the immersion space LS is directed from the inside to the outside of the substrate P, for example. The interface distance information includes information regarding the maximum distance from the gap Ga to the interface 131 of the immersion space LS on the outside of the substrate P. The interface distance information includes information indicating a distance between the gap Ga and the interface 131 in a radiation direction on the optical axis of the projection optical system PL, for example.

In addition, the interface distance information may include information indicating the distance from the gap Ga to the interface 131 of the immersion space LS on the outside of the substrate P when the absolute value of the acceleration of the substrate stage 2P is minimized. In addition, the interface distance information may include information indicating the distance between the gap Ga and the interface 131 in a radiation direction from the center of the substrate P held on the substrate stage 2P. In addition, the interface distance information may include information indicating the distance between the gap Ga and the interface 131 in a movement direction (scanning direction) of the substrate stage 2P during the scanning exposure operation. In addition, the interface distance information may include information indicating the distance between the gap Ga and the interface 131 in a direction crossing the scanning direction.

Incidentally, in the immersion space LS, when the movement direction of the substrate stage 2P changes, the separated liquid is likely to occur as a distance from the position of the gap Ga that the immersion space LS crosses to the interface 131 of the immersion space LS becomes short. In other words, the interface distance information can be used as information for estimating one or both of the probability and the amount of generation of separated liquid, for example.

As shown in FIG. 11, the scale member 22 of the present embodiment may be disposed so as to have the gap Gb for the cover member 21 held on the substrate stage 2P. In the present embodiment, the immersion space LS may be disposed on the upper surface 40 of the cover member 21 and the upper surface 45 of the scale member 22 so as to cross the gap Gb. In the present embodiment, in the same manner as in the explanation regarding the gap Ga, the liquid information includes number-of-submergences information regarding the gap Gb, submergence time information regarding the gap Gb, elapsed time information regarding the gap Gb, and interface distance information regarding the gap Gb.

In the present embodiment, the liquid information calculation section 124 shown in FIG. 7 calculates the above-described liquid information on the basis of the first movement information. In the present embodiment, the liquid information calculation section 124 acquires the first movement information calculated by the first movement information calculation section 123 from the first movement information storage section 118, and calculates the liquid information on the basis of the acquired first movement information. In the present embodiment, using the first movement information, the liquid information calculation section 124 calculates the two-dimensional shape (profile) of the immersion space LS projected onto the XY plane on the basis of the physical model when the shear force (force almost parallel to the XY plane) that the immersion space LS receives from the facing region A1, the surface tension acting on the interface 131 of the immersion space LS, and the like are taken into consideration. In the present embodiment, the liquid information calculation section 124 calculates the information indicating the movement of the interface 131 of the immersion space LS without performing unsteady computation of the flow field within the immersion space LS.

In the present embodiment, the liquid information calculation section 124 acquires the computation condition information, which is required for the calculation of the liquid information, from the computation condition information storage section 116. In the present embodiment, the physical model used to calculate the liquid information includes parameters determined by physical properties such as the viscosity of the liquid LQ, physical properties such as the contact angle of the substrate P with respect to the liquid LQ of the substrate P, and the like. In the present embodiment, the parameters of the physical model are adjusted using the detection result of the movement of the liquid when moving an object according to the first movement information. These parameter are adjusted on the basis of a measurement result, which is obtained by measuring the movement of the liquid when moving the object, so that the calculation result of the simulator 105 approaches the measurement result, for example. The parameters of the physical model used in the liquid information calculation section 124 may be adjusted using the calculation result of the movement of the liquid according to various methods based on computation fluid dynamics (CFD), such as a method of solving the Navier-Stokes equation numerically directly (DNS) and a method that uses an interface tracking method, such as a level setting method, using a turbulence model appropriately. In the present embodiment, as the parameters included in the physical model used to calculate the liquid information, values corresponding to the type of the liquid LQ and the type of the substrate P are stored in the computation condition information storage section 116. In the present embodiment, the liquid information calculation section 124 acquires information, which indicates the values of the parameters included in the physical model, from the computation condition information storage section 116 on the basis of information that the operator inputs as information indicating the type of the liquid LQ, the type of the substrate P, and the like, and calculates the liquid information, for example. In the present embodiment, the liquid information calculation section 124 stores the calculated liquid information in the liquid information storage section 119.

In addition, as a method of calculating the liquid information, it is possible to use various methods based on the computation fluid dynamics described above. For example, the liquid information calculation section 124 may calculate the flow field of the immersion space LS and the gas space GS by unsteady calculation, or may calculate a three-dimensional flow field. In addition, the information that the liquid information calculation section 124 uses to calculate the liquid information may include information indicating the temperature, humidity, pressure, and the like of the environment where the immersion space LS is disposed, for example. In addition, the parameters included in the physical model used to calculate the liquid information may be fixed values.

In the present embodiment, the region information calculation section 125 calculates region information indicating a region where the liquid information satisfies predetermined conditions of the facing region A1 shown in FIG. 10 and the like. In the present embodiment, the region information calculation section 125 acquires the liquid information calculated by the liquid information calculation section 124 from the liquid information storage section 119, and calculates the region information on the basis of the acquired liquid information. In the present embodiment, the region information calculation section 125 stores the calculated region information in the region information storage section 120.

In the present embodiment, the predetermined conditions include a plurality of conditions, and the region where the predetermined conditions are satisfied includes a region where at least one of the predetermined conditions is satisfied. For example, the region information calculation section 125 calculates first region information, which indicates a region satisfying a first condition of the predetermined conditions, and second region information, which indicates a region satisfying a second condition of the predetermined conditions. In this case, the region indicated by the first region information may overlap a part of the region indicated by the second region information, or may not overlap the region indicated by the second region information.

In the present embodiment, the region information calculation section 125 compares liquid information in at least a part of the facing region A1 with the predetermined conditions, and determines whether or not each region on the facing region A1 (each position) satisfies the predetermined conditions. In addition, the region information calculation section 125 extracts a region, which satisfies the predetermined conditions, of the facing regions A1 on the basis of the above-described determination.

In the present embodiment, the predetermined conditions include a condition in which a distance from the gap of the facing region A1 that the immersion space LS crosses to the interface 131 of the immersion space LS is equal to or less than a threshold value. The threshold value is a value determined according to some or all of various conditions including parameters, such as the physical properties of the liquid LQ of the immersion space LS, physical properties including the contact angle of the facing surface 130 with respect to the liquid LQ, the size of the gap of the facing region A1, and the size of the immersion space LS, and a direction specifying the distance from the position (for example, the first portion 132) in the gap to the interface 131, for example.

In the present embodiment, the information indicating the threshold value of the distance from the gap of the facing region A1 to the interface 131 of the immersion space LS is stored in the computation condition information storage section 116. In the present embodiment, the region information calculation section 125 calculates region information indicating the position of a region, from which a maximum distance to the interface 131 of the immersion space LS is equal to or less than the threshold value, of the gap of the facing region A1 that the immersion space LS crosses as a region satisfying the predetermined conditions, with reference to the computation condition information, the interface distance information, and the like. The region information can be used as information indicating a region of the facing surface 130 where the separation of the liquid LQ from the immersion space LS occurs relatively easily, for example.

Here, examples of the movement path and the immersion space shown in FIGS. 8A to 8D will be described. As shown in FIGS. 8A to 8D, the immersion space LS moves relative to the substrate P as the substrate P performs relative movement along (in) the first movement path Tr1. For example, in FIG. 8A, when the projection region PR scans (scanning exposure operation) the first shot region S1 in the +Y direction due to the movement of the substrate P in the −Y direction, the immersion space LS moves from the inside toward the outside of the substrate P. The shot region S1 is close to the gap Ga. Therefore, as shown in FIG. 8B, in at least a part of a period which is from the end of the exposure of the first shot region S1 until the exposure of the second shot region S2 exposed next is started, the immersion space LS is in a state where a part of the immersion space LS crosses (bridges over) the gap Ga between the substrate P and the cover member 21. FIG. 8B shows a point in time when the movement direction of the substrate P changes from the −Y direction to the +Y direction, and FIG. 8C shows a state immediately before the projection region PR starts the scanning of the second shot region S2.

Figure 8A:
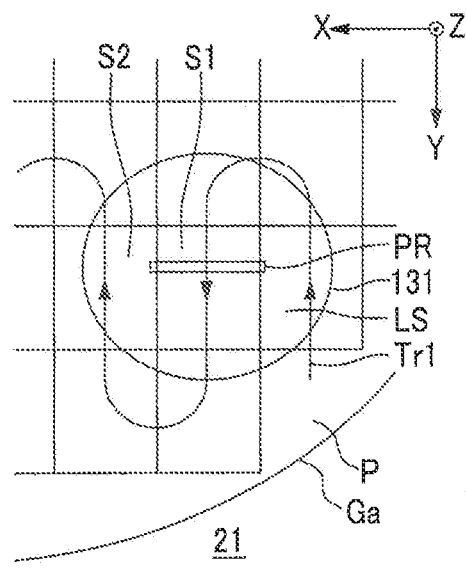
FIGS. 8A to 8D are diagrams showing examples of the movement trajectory and the immersion space of the present embodiment.
Figure 8C:
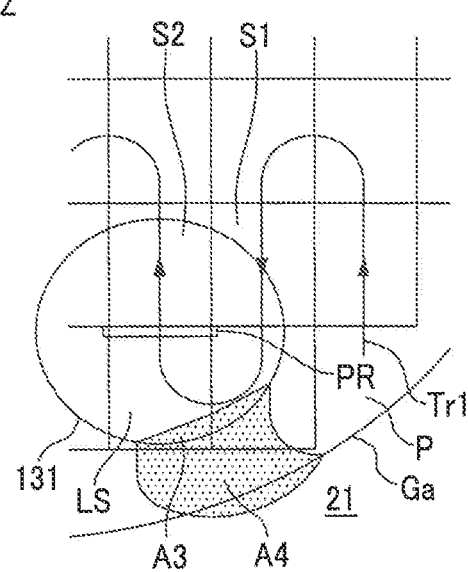
Figure 8B:
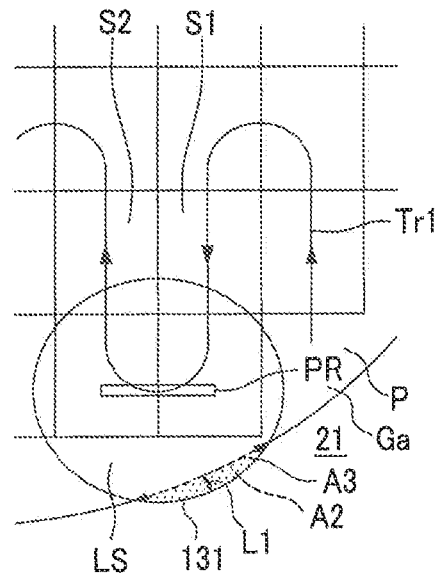

As shown in FIGS. 8A to 8C, a region in the gap Ga between the substrate P and the cover member 21 in which the immersion space LS crosses (hereinafter, referred to as a submergence region A2) changes with the relative movement of the immersion space LS. The distance L1 from the submergence region A2 to the interface 131 of the immersion space LS changes spatially according to a difference in the position in the gap Ga, for example, as shown in FIG. 8B. In addition, for example, as shown in FIGS. 8B and 8C, the distance L1 from the submergence region A2 to the interface 131 of the immersion space LS changes in time with the relative movement of the immersion space LS and the gap Ga.

In the present embodiment, the region information calculation section 125 calculates region information indicating the position of the submergence region A2 from which the maximum value of the distance L1 to the interface 131 of the immersion space LS is equal to or less than the threshold value. When the maximum value of the distance L1 from the submergence region A2 to the interface 131 of the immersion space LS is equal to or less than the threshold value, the immersion space LS includes a space A3 disposed on the outside of the substrate P with respect to the submergence region A2, as shown in FIG. 8B. In the present embodiment, the region information calculation section 125 calculates region information indicating the position of the space A3. In addition, in the present embodiment, the region information calculation section 125 calculates region information indicating the position of a region A4 (refer to FIG. 8C) in the facing surface 130 disposed in at least a part of a surrounding of the space A3. In the present embodiment, the region A4 includes a region where the space A3 comes in contact with the facing surface 130 with the movement of the substrate stage 2P. In the present embodiment, the region A4 includes a region on the substrate P, to which the interface 131 passing above the region A3 when the substrate P moves in the +Y direction moves, among the interface of the immersion space LS formed outside the substrate P. Such region information indicating the submergence region A2 can be used as information indicating a region of the gap of the facing region A1 that relatively easily becomes a starting point at which the separated liquid is generated, for example. In addition, the region information indicating the region A4 can be used as information indicating a region in the facing region A1 where the separated liquid is generated (adheres) relatively easily, for example. In addition, the entire region on the substrate P that the interface 131 passes through until the substrate P starts the step movement in the X direction after the end of the exposure of the shot region S2 may be set as the region A4, or the width (distance) of the region A4 in the Y direction may be set on the basis of an experiment, simulation, and the like.

In addition, the region information calculation section 125 of the present embodiment extracts a region of the region A4 that comes in contact with the immersion space LS once, as a region satisfying the predetermined conditions, with reference to the number-of-contacts information and the like, and calculates region information indicating the position of the extracted region. The region information can be used as information indicating a region in the facing surface 130 where the separated liquid remains relatively easily, for example.

In addition, the region information calculation section 125 of the present embodiment extracts a region that comes in contact with the immersion space LS again after the contact with the immersion space LS, as a region satisfying the predetermined conditions, with reference to the number-of-contacts information and the like, and calculates region information indicating the position of the extracted region. The region information can be used as information indicating a region where separated liquid is unlikely to remain since the separated liquid flows into the immersion space LS due to the next contact with the immersion space LS even if the separated liquid is generated by the first contact with the immersion space LS, for example. For example, a region of the region A4 that comes in contact with the immersion space LS again can be removed from the region A4.

As described above, the region information calculation section 125 of the present embodiment calculates information regarding the separation of the liquid from the immersion space LS by comparing the liquid information with the predetermined conditions. For example, the region information calculation section 125 calculates liquid residual information, which indicates the distribution on the facing surface 130 of the probability that the separated liquid remains, by giving a weighting to the parameters indicated by various kinds of information with reference to at least one of information indicating a region where the separated liquid is likely to occur, information indicating a region where the separated liquid is likely to remain, and information indicating a region where the separated liquid is difficult to remain. The liquid residual information includes information in which the position (coordinates) on the facing surface 130 and the probability that the separated liquid remains are associated with each other, for example.

In the present embodiment, the predetermined conditions include a condition in which the number of times the immersion space LS crosses a portion of the gap of the facing region A1 (the number of times of submergence) is 1. In the present embodiment, the region information calculation section 125 calculates region information indicating the position of a gap (region), the number of times of submergence of which is 1, in the gap of the facing region A1 with reference to the number-of-submergences information of the liquid information and the like. The region information can be used as information for extracting, from the facing region A1, a region where a possibility that air bubbles will be generated in the immersion space LS is low, for example.

In the present embodiment, the predetermined conditions include a condition in which the time for which the immersion space LS crosses a portion of the gap of the facing region A1 is equal to or greater than the threshold value. The threshold value is a value determined by at least one of the parameters, such as the physical properties of the liquid LQ of the immersion space LS, physical properties including the contact angle of the facing surface 130 with respect to the liquid LQ, the size of the gap of the facing region A1, and the size of the immersion space LS, for example. In the present embodiment, information indicating the threshold value of the crossing time of the immersion space LS is stored in the computation condition information storage section 116. In the present embodiment, the region information calculation section 125 extracts a gap (region), the time for which the liquid crosses the gap being equal to or greater than the threshold value, of the gap of the facing region A1, as a region satisfying the predetermined conditions, with reference to the computation condition information, the submergence time information, and the like, and calculates the region information indicating the position of the extracted gap. The region information can be used as information indicating a gap (region) where the probability and the amount of occurrence of the bridge phenomenon are relatively high, for example. In addition, the region information can be used as information for extracting, from the facing region A1, a region where a possibility that air bubbles will be generated in the immersion space LS is high, for example.

In the present embodiment, the predetermined conditions include a condition in which the number of times the immersion space LS crosses a portion of the gap of the facing region A1 is 2 or more. In the present embodiment, the region information calculation section 125 extracts a region, the number of times of submergence of which is 2, in the gap of the facing region A1 with reference to the number-of-submergences information of the liquid information and the like, and calculates region information indicating the position of the extracted region. In addition, in the present embodiment, the region information calculation section 125 also extracts a region, the number of times of submergence of which is 3, in the gap of the facing region A1, classifies part regions in the gap of the facing region A1 according to the number of times of submergence, and calculates region information corresponding to the number of times of submergence. Such region information can be used as information for extracting, from the facing region A1, a region where a possibility that air bubbles will be generated in the immersion space LS having passed above the extracted gap (region) is high, for example.

In addition, a region satisfying the condition in which the number of times of submergence is 2 or more can also be treated as a region that does not satisfy the condition in which the number of times of submergence is 1. Thus, the simulator 105 may calculate region information indicating a region that does not satisfy the predetermined conditions.

In the present embodiment, the region where the liquid information satisfies the predetermined conditions includes at least a part of a surrounding of a gap (region), the number of times of submergence of which is 2 or more, in the gap of the facing region A1. In the present embodiment, the region information calculation section 125 extracts a region (as a region satisfying the predetermined conditions) in at least a part of the facing surface 130 of the facing region A1 in contact with the immersion space LS while the immersion space LS is formed on a gap (region) satisfying the conditions that the number of times of submergence is 2 or more, as a region where a possibility that air bubbles will be generated (air bubbles will adhere) in the immersion space LS is high, with reference to at least either the liquid contact information or the number-of-submergences information, and calculates region information indicating the position of the extracted region. In addition, it is also possible to extract a region in at least a part of the facing surface 130 with which the immersion space LS having passed above a gap (region), which satisfies the conditions that the number of times of submergence is 2 or more, newly comes in contact.

Figure 9A:
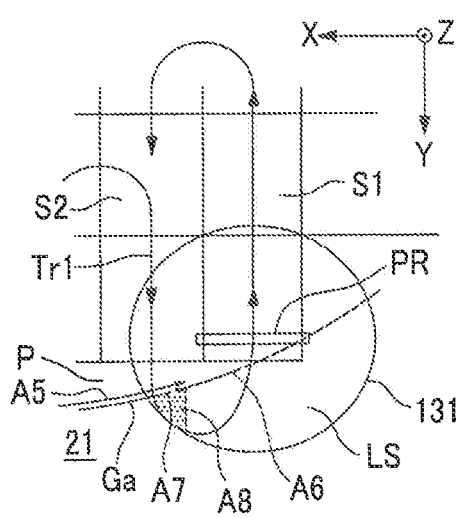
FIGS. 9A to 9D are diagrams showing examples of the movement trajectory and the immersion space of the present embodiment.
Figure 9C:
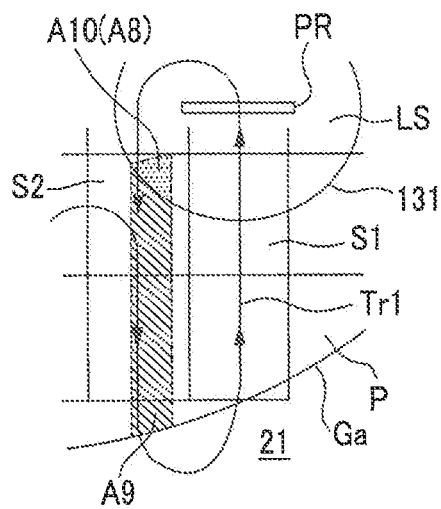
Figure 9B:
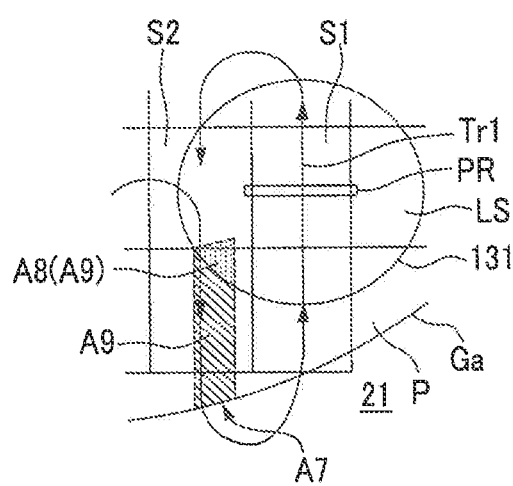

Here, examples of the movement trajectory and the immersion space shown in FIGS. 9A to 9D will be described. In FIG. 9A, the immersion space LS is moving in the −Y direction from the outside to the inside of the substrate P. The immersion space LS moves in the −Y direction from the outside to the inside of the substrate P (stepping operation, step movement) after the projection region PL passes through the shot region S before the first shot region S1 and moves in the −X direction. FIG. 9A shows a state immediately after the end of step movement in the −X direction. A submergence region A6 in a state shown in FIG. 9A overlaps a part of a submergence region A5 that has submerged at least once before the submergence of the submergence region A6. In a submergence region A7 where the submergence regions A5 and A6 overlap each other, the number of times of submergence is 2 or more. In FIG. 9A, the immersion space LS includes a space (region) A8 located outside the substrate P. The space A8 of the immersion space LS passes above the submergence region A7 (gap) when the immersion space LS moves in the −Y direction. In the present embodiment, a region at a surrounding of the submergence region A7, the number of times of the crossing of the immersion space LS of which is 2 or more, includes a region A9 on the substrate above which the space A8 of the immersion space LS passes. As shown in FIG. 9B, the region A9 may include the second shot region S2, which is exposed after the first shot region S1, while the projection region PR is scanning the first shot region S1. In addition, as shown in FIG. 9C, in the region A9, a region A10 that is not out of the immersion space LS may be included in the second shot region S2 while the projection region PR is moving from the first shot region S1 to the second shot region S2, that is, before the start of the exposure of the second shot region S2 after the end of the exposure of the first shot region S1. The region A9 is a region where a possibility that gas will be generated in the immersion space LS and air bubbles will adhere onto the substrate P is high since the space A8 of the immersion space LS passes through the submergence region A7. A region of the region A9 through which the immersion space LS passes is a region where a possibility that air bubbles adhered onto the substrate P will disappear immediately after the immersion space LS passes through the region is high. In addition, a region through which the immersion space LS does not pass, such as the region A10, is a region where a possibility that air bubbles will adhere is high.

The region information calculation section 125 of the present embodiment extracts the region A9 in contact with the immersion space LS (space A8) having passed above the submergence region A7 the number of times of submergence of which is 2 or more, of the second shot region S2, and calculates region information indicating the extracted region. The region information indicating the region A9 can be used as information indicating a region to which air bubbles mixed into the immersion space LS may be carried, for example.

The region information calculation section 125 of the present embodiment extracts the region A10 that is not disposed on the outside (gas space GS) of the immersion space LS until the projection region PR reaches the second shot region S2 from the first shot region S1, of the region A9, and calculates region information indicating the position of the extracted region A10. The region information indicating the region A10 can be used as information indicating a region where air bubbles may be present of the shot region exposed next, for example. In addition, the region information indicating the region A10 can be used as information for extracting a shot region that is subjected to scanning exposure with air bubbles adhered.

The region information calculation section 125 of the present embodiment may calculate the information regarding air bubbles in the immersion space LS by comparing the liquid information with the predetermined conditions. In the present embodiment, the region information calculation section 125 calculates information regarding the probability, amount, and the like of the occurrence of the bridge phenomenon when the immersion space LS crosses a region of a gap, the number of times of submergence of which is 2 or more, a second time or more with reference to the submergence time information, the information indicating the elapsed time after the immersion space LS passes through the gap, and the like. In addition, information regarding the probability that the gas on the liquid causing the bridge phenomenon is taken into the immersion space LS when the immersion space LS crosses the gap Ga where the bridge phenomenon occurs, information regarding the amount, and the like are calculated. In addition, the region information calculation section 125 calculates a probability that air bubbles are present in the immersion space LS during exposure and bubble distribution information indicating the distribution of the expected value of the amount of air bubbles and the like, for example, by giving a weighting to the parameters indicated by various kinds of information with reference to at least one of information indicating the space A8 of the immersion space LS having passed through the submergence region A7, the number of times of submergence of which is 2 or more, of the gap of the facing region A1, information indicating the region A9 in contact with the space A8 of the immersion space LS in the facing surface 130, and information indicating the region A10, which is not disposed outside the immersion space LS, of the region A9. The bubble distribution information includes at least either or both of the information indicating the probability that air bubbles are present in the immersion space LS during exposure in each shot region S and the information indicating the expected value of the amount of air bubbles that are present, for example.

In the present embodiment, the second movement information calculation section 126 shown in FIG. 7 calculates the second movement information indicating the movement of the object (substrate P), which faces the terminating optical element 12 that emits the exposure light EL, on the basis of the region information described above. In the present embodiment, the second movement information calculation section 126 stores the calculated second movement information in the second movement information storage section 121.

In the present embodiment, the second movement information includes at least one of the position information, speed information, and acceleration information of the substrate stage 2P on which the substrate P is disposed, similar to the first movement information. That is, in the present embodiment, the second movement information calculation section 126 determines a second movement trajectory of the substrate P so that a plurality of shot regions specified in the shot map information pass through the projection region. In addition, in the present embodiment, the second movement information calculation section 126 calculates the second movement information so that the movement of the substrate P satisfies the operating conditions specified in the apparatus information and the exposure conditions specified in the computation condition information.

In the present embodiment, the second movement information calculation section 126 calculates the second movement information with reference to the region information calculated on the basis of the liquid information. In the present embodiment, at least one of the path, speed, and acceleration of the movement of the object indicated by the second movement information is different from that of the movement of the object indicated by the first movement information in at least a part of the facing region A1 where the liquid information satisfies the predetermined conditions. For example, the movement trajectory of the substrate P based on the second movement information is different from the movement trajectory of the substrate P based on the first movement information.

For example, when a region where the liquid information satisfies the predetermined conditions as described above occurs if the substrate P is moved according to the movement trajectory determined on the basis of the first movement information in order to expose the first and second shot regions S1 and S2 sequentially, the second movement information calculation section 126 of the present embodiment calculates the second movement information so that the step movement in the scanning direction (Y direction) becomes long in the step movement from the first shot region S1 to the second shot region S2. A method of increasing the step movement distance in the scanning direction (Y direction) will be called an overscan method.

Figure 8D:
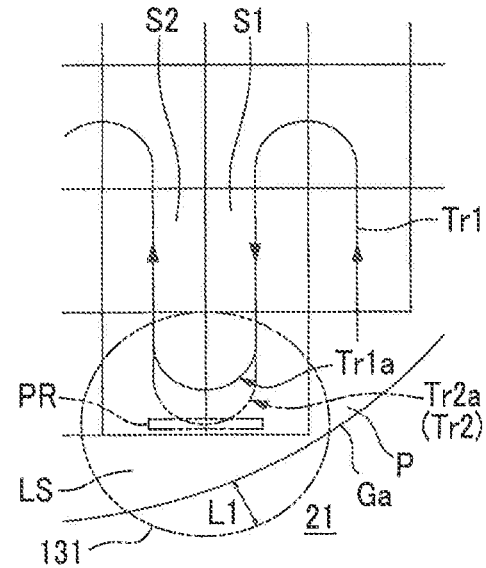

For example, as in the example shown in FIG. 8C, when the region A4 satisfying the predetermined conditions occurs when exposing the first and second shot regions S1 and S2 sequentially while moving the substrate P along (in) a first path Tr1a based on the first movement information, the second movement information calculation section 126 calculates the second movement information so that the substrate P is moved along a second path Tr2a shown in FIG. 8D, that is, the distance of the step movement in the scanning direction (Y direction) after the end of the exposure of the first shot region S1 becomes longer than the first path Tr1a based on the first movement information. In the example of FIG. 8D, the second movement information calculation section 126 of the present embodiment calculates the second movement information so that the distance from the interface 131 in at least a part of the gap Ga that the immersion space LS crosses become longer than that in a case where the substrate P is moved on the basis of the first movement information. The second movement information calculation section 126 of the present embodiment calculates the second movement information so that a region (gap), in which the distance between the interface of the immersion space LS formed outside the substrate P and the gap Ga is smaller than the threshold value, is eliminated or the rate of the region (gap) where the distance is smaller than the threshold value is reduced, compared with a case where the substrate P passes along the first path Tr1a.

As shown in FIG. 8D, when the substrate P is moved along the second moving path Tr2 based on the second movement information, one or both of the probability and the amount of generation of the separated liquid are reduced since the immersion space LS passes above the gap Ga from the outside to the inside of the substrate P in a state where the interface 131 of the immersion space LS is stable, for example.

Figure 9D:
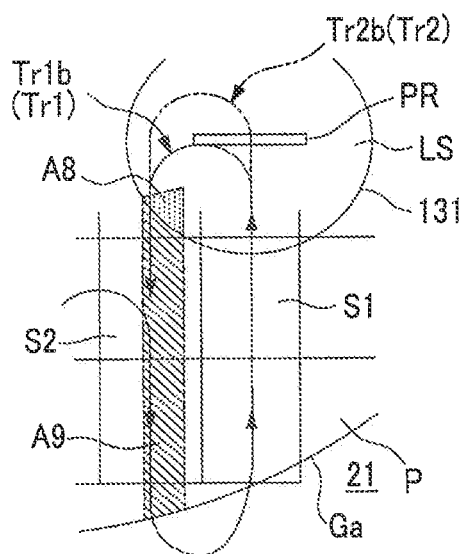

In addition, for example, as in the example shown in FIG. 9C, when the region A10 satisfying the predetermined conditions is present when exposing the first and second shot regions S1 and S2 sequentially while moving the substrate P along a first path Tr1b based on the first movement information, the second movement information calculation section 126 calculates the second movement information so that the substrate P is moved along a second path Tr2b shown in FIG. 9D, that is, the distance of the step movement in the scanning direction (Y direction) after the end of the exposure of the first shot region S1 become longer than the first path Tr1b based on the first movement information. In the example shown in FIG. 9D, the second movement information calculation section 126 of the present embodiment calculates the second movement information so that the region A10 shown in FIG. 9C does not occur, that is, the region A9 in the second shot region S2 is disposed outside the immersion space LS, in at least a part of the period from the end of the exposure of the first shot region S1 to the start of the exposure of the second shot region S2. The second movement information calculation section 126 of the present embodiment calculates the second movement information so that the space A8 of the immersion space LS is not in contact with the second shot region S2 in at least a part of the period from the end of the exposure of the first shot region S1 to the start of the exposure of the second shot region S2.

As shown in FIG. 9D, when the substrate P is moved according to the second movement information, air bubbles are not present in the immersion space LS (projection region PL) during the exposure of the second shot region S2 or the probability that air bubbles are present is reduced since the region A9 included in the second shot region S2 is disposed outside the immersion space LS before the start of the exposure of the second shot region S2 exposed next.

In addition, after the end of the exposure of the first shot region S1, the distance of the step movement in the scanning direction (Y direction) is calculated in consideration of the size of a shot region (length of the direction), the size and shape of the immersion space LS, and the like so that the conditions "the region A9 included in the second shot region S2 is disposed outside the immersion space LS" are satisfied. In addition, the overscan method includes a method of calculating movement information on the assumption that a third shot region is present between the first and second shot regions S1 and S2, for example. For example, the simulator 105 may calculate movement information (second movement information), in which the overscan method is substantially considered, by making the first movement information calculation section 123 calculate the movement information on the assumption that the third shot region is present in addition to the shot region indicated by the shot map information. In this case, the first movement information calculation section 123 may also function as the second movement information calculation section 126. In addition, the third shot region may be a region that is not irradiated with exposure light, or may be a region irradiated with exposure light.

As described above, in the present embodiment, in the second moving path of the substrate P indicated by the second movement information, a path from the first shot region S1 to the second shot region S2 is long compared with the first moving path indicated by the first movement information. Therefore, a time taken for the immersion space LS to move from the first shot region S1 to the second shot region S2 becomes long.

In addition, when a region where the liquid information satisfies the predetermined conditions occurs when exposing the first and second shot regions S1 and S2 sequentially while moving the substrate P on the basis of the first movement information, the second movement information calculation section 126 may make one or both of the scanning exposure speed and the step movement speed of the substrate P lower than the speed based on the first movement information so that at least one of the generation of residual liquid and the generation of air bubbles in the immersion space LS is prevented in the region. The method of slowing down one or both of the scanning exposure speed and the step movement speed of the substrate P will be called a reduce scan method. For example, as shown in FIG. 8B, when the region A4 occurs when the substrate P is moved on the basis of the first movement information, the second movement information may be calculated so that at least one of the scanning exposure speed and the step movement speed of the substrate P becomes lower than the speed based on the first movement information in at least a part of the period for which the immersion space LS is formed on the gap Ga. For example, in the example shown in FIG. 8B, at least one of the step movement speed of the substrate P in the −X direction and the step movement speed of the substrate P in the +Y direction before the start of the exposure of the second shot region S2 after the end of the exposure of the first shot region S1 may be reduced. In addition, for example, in the example shown in FIG. 8B, the scanning exposure speed of the second shot region S2 may be reduced when the immersion space LS is present on the gap Ga even after the start of the exposure of the second shot region S2. If necessary, the scanning exposure speed of the first shot region S1 or the step movement speed in the −Y direction after the end of the exposure of the first shot region S1 may also be reduced. Thus, by reducing at least one of the scanning exposure speed and the step movement speed of the substrate P in at least a part of the period for which the immersion space LS is formed on the gap Ga, it is possible to prevent or suppress the generation of residual liquid on the substrate P even if the distance between the gap Ga and the interface 131 of the immersion space LS formed outside the substrate P is small, for example, as shown in FIG. 8B.

In addition, for example, as shown in FIGS. 9A to 9D, when the regions A9 and A10 occur when the substrate P is moved on the basis of the first movement information, the second movement information may be calculated so that at least one of the scanning exposure speed and the step movement speed of the substrate P becomes lower than the speed based on the first movement information in at least a part of the period for which the immersion space LS is formed on the gap Ga. For example, in the example shown in FIGS. 9A to 9D, the step movement speed of the substrate P in the +Y direction before the exposure of the first shot region S1 is reduced. That is, the speed of the substrate P during step movement in the +Y direction before the exposure of the first shot region S1, for which the space A8 of the immersion space LS is formed on the gap Ga (submergence region A7), is reduced. In addition, for example, in the example shown in FIGS. 9A to 9D, the scanning exposure speed of the first shot region S1 may be reduced when the space A8 of the immersion space LS is present on the gap Ga even after the start of the exposure of the first shot region S1. If necessary, the step movement speed in the +X direction before the start of the exposure of the first shot region S1 or the step movement speed in the −Y direction before the start of the exposure of the first shot region S1 may also be reduced. Thus, by reducing at least one of the scanning exposure speed and the step movement speed of the substrate P in at least a part of the period for which the immersion space LS is formed on the gap Ga, it is possible to prevent or suppress the generation of air bubbles in the immersion space LS even when the immersion space LS moves above the submergence region A7 again, for example, as shown in FIGS. 9A to 9D.

In addition, when a region where the liquid information satisfies the predetermined conditions occurs when exposing the first and second shot regions S1 and S2 sequentially while moving the substrate P on the basis of the first movement information, the second movement information calculation section 126 may calculate the second movement information so that the substrate P is stopped in a part of the period from the end of the exposure of the first shot region S1 to the start of the exposure of the second shot region S2. The method of stopping the substrate P during the step movement will be called a pause method. For example, as shown in FIG. 8B, even if the distance between the gap Ga and the interface 131 of the immersion space LS formed outside the substrate P is small, the interface 131 passes above the gap Ga after the deformation of the interface 131 on the outside of the substrate P is reduced since the substrate P is stopped. Therefore, it is possible to prevent or suppress the generation of residual liquid on the substrate P or the generation of air bubbles in the immersion space LS. In addition, also in the example shown in FIGS. 9A to 9D, the region A9 within the second shot region S2 may be disposed outside the immersion space LS by stopping the substrate P after the end of the exposure of the first shot region.

In addition, any one of the overscan method, the reduce scan method, and the pause method described above may be independently used, or two or more of these methods may be used in combination.

In addition, in the methods described above or separately from the methods described above, for example, the time average value of the absolute value of the speed of the substrate P specified in the second movement information may be made to be smaller than the time average value of the absolute value of the speed of the substrate P specified in the first movement information in a path from the first shot region S1 to the second shot region S2, and the time average value of the absolute value of the acceleration of the substrate P specified in the second movement information may be made to be smaller than the time average value of the absolute value of the acceleration of the substrate P specified in the first movement information in a path from the first shot region S1 to the second shot region S2.

In the present embodiment, the second movement information calculation section 126 calculates the second movement information so that the moving path adjusted so as to suppress the generation of separated liquid and the moving path adjusted so as to suppress the remaining of air bubbles are determined.

The second movement information calculation section 126 of the present embodiment may calculate the second movement information on the basis of inspection information. The inspection information of the present embodiment includes information indicating a result obtained when the inspection apparatus 103 shown in FIG. 1 inspects the exposed substrate P while moving the substrate P on the basis of the first movement information. In the present embodiment, the information indicating the inspection result of the inspection apparatus 103 includes information indicating the position of a shot region where exposure failure due to the remaining of separated liquid has occurred. For example, the second movement information calculation section 126 may calculate the second movement information so that the remaining of separated liquid is suppressed in a shot region where the inspection information indicates the remaining of separated liquid.

In the present embodiment, when information indicating the position of a shot region where exposure failure due to the mixing of air bubbles into the immersion space LS has occurred is included in the information indicating the inspection result of the inspection apparatus 103, the second movement information calculation section 126 may calculate the second movement information so that the remaining of air bubbles is suppressed in the shot region where the inspection information indicates the mixing of air bubbles to the immersion space LS.

In addition, when information indicating the detection result of the first detection system 7 of the exposure apparatus EX is included in the inspection information of the present embodiment, the second movement information calculation section 126 may calculate the second movement information so that the remaining of separated liquid is suppressed in a shot region where the inspection information indicates the remaining of separated liquid.

In addition, the simulator 105 of the present embodiment may calculate information regarding the immersion space LS in each region of the facing region A1 where the immersion space LS is formed. For example, the simulator 105 of the present embodiment can also calculate information regarding the immersion space A that crosses the gap Gb between the cover member 21 and the scale member 22.

Figure 12:
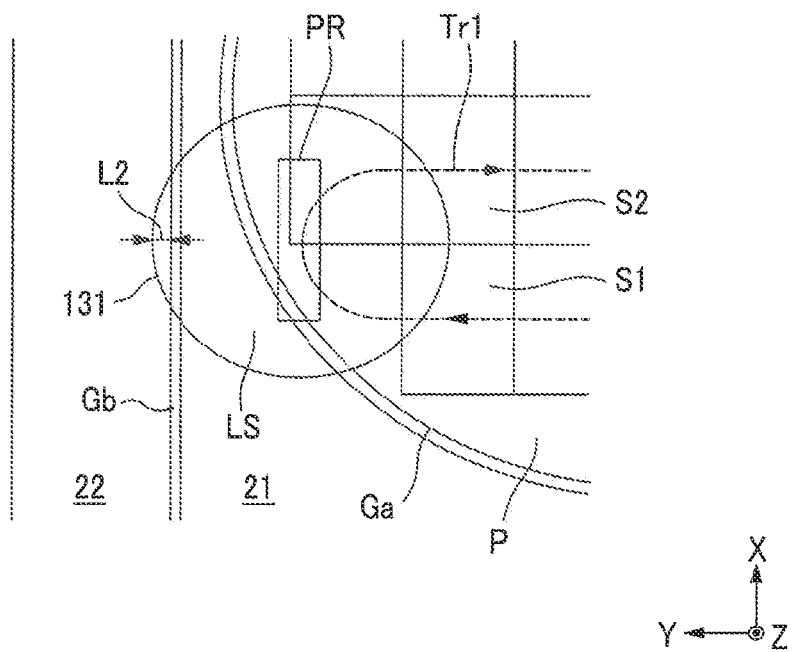
FIG. 12 is a diagram showing examples of the movement trajectory and the immersion space of the present embodiment.

FIG. 12 is a diagram showing other examples of the movement trajectory and the immersion space of the present embodiment. In the example shown in FIG. 12, since the first shot region S1 is disposed near the gap Gb between the cover member 21 and the scale member 22, the immersion space LS may cross the gap Gb in at least a part of the period from the end of the exposure of the first shot region S1 to the start of the exposure of the second shot region S2.

In the present embodiment, in the same manner as in the explanation regarding the gap Ga between the substrate P and the cover member 21, separated liquid may be generated if a distance L2 from the interface 131 of the immersion space LS, which crosses the gap Gb, to the gap Gb is less than the threshold value. In the present embodiment, the simulator 105 may calculate region information indicating the position of a portion of the gap Gb whose distance L2 is less than the threshold value. In addition, the simulator 105 may calculate region information indicating the position of a second space of the immersion space LS, which is disposed outside the substrate P, for a second portion of the gap Gb whose distance L2 is less than the threshold value. In addition, the simulator 105 may calculate region information indicating the position of a region of the cover member 21 that comes in contact with the second space of the immersion space LS by the movement of the substrate stage 2P. In addition, the simulator 105 may calculate region information indicating the position of a region of the substrate P that comes in contact with the second space of the immersion space LS by the movement of the substrate stage 2P. In addition, the simulator 105 may calculate the second movement information so that the generation of separated liquid near the gap Gb is suppressed.

In addition, the simulator 105 may calculate information regarding the immersion space LS in the facing region A1 when the facing region A1 where the immersion space LS is formed does not include a gap. In addition, the simulator 105 may calculate information regarding the liquid in the facing region A1 at the time of operation other than the exposure process in addition to the information regarding the immersion space A when performing the exposure process. For example, the simulator 105 may calculate the information of the liquid in the facing region A1 on the measuring stage 2C. The simulator 105 may calculate information regarding the liquid, which is different from the liquid LQ that forms the immersion space LS, in the facing region A1 on one or both of the substrate stage 2P and the measuring stage 2C. For example, the simulator 105 may calculate information regarding the liquid that is disposed on the facing region A1 in order to wash the facing region A1.

In the present embodiment, the image information calculation section 127 shown in FIG. 7 calculates (generates) image information for displaying various kinds of information, which are stored in the information storage unit 111, as an image. The image information calculation section 127 acquires information to be displayed, which is designated by the operator, from the information storage unit 111, for example, according to a command from the operator. Then, on the basis of the acquired information, the image information calculation section 127 calculates image information indicating an image in which a graph, a table, and the like corresponding to this information are drawn. In the present embodiment, the image information calculation section 127 stores the calculated image information in the image information storage section 122.

Figure 13:
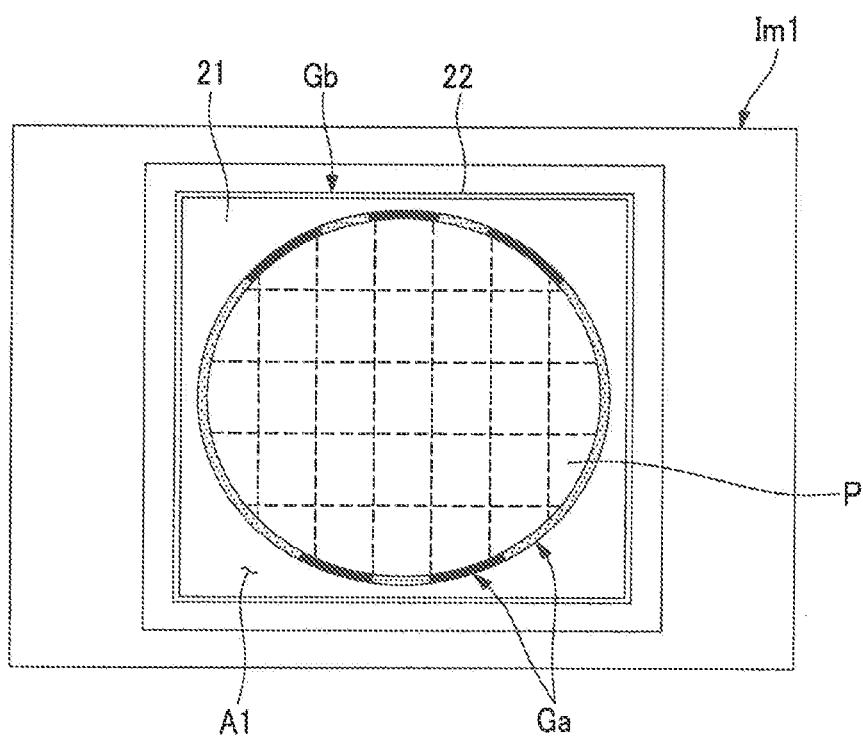
FIG. 13 is a diagram showing an example of an image indicated by image information of the present embodiment.

FIG. 13 is a diagram showing an example of an image Im1 showing the number of times of submergence of the present embodiment. The image information calculation section 127 of the present embodiment acquires information, which indicates the distribution of the number of times of submergence in a gap (for example, the gap Ga) of the facing region A1, from the region information storage section 120, for example, when a command of the display of the number of times of submergence is received from the operator. The image information calculation section 127 of the present embodiment calculates image information for distinctively displaying the positions where the number of times of submergence is different, according to the number of times the immersion space LS crosses each position of the gap Ga, on the basis of the information indicating the distribution of the number of times of submergence. In the present embodiment, the image information calculation section 127 forms the image information so that images, in which one or both of the color and the brightness to display each position of the gap Ga are different according to a difference in the number of times of submergence, are obtained. In the present embodiment, the image information calculation section 127 can also output image information based on the video format by forming an image indicating the distribution of the number of times of submergence at each time and arranging such images in order of time.

Figure 14:
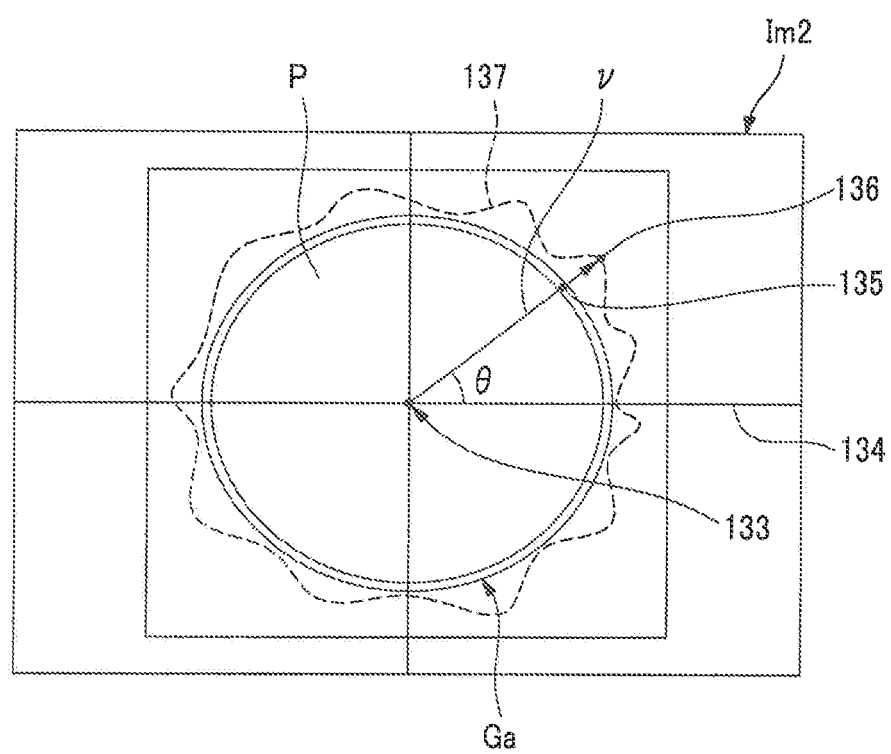
FIG. 14 is a diagram showing an example of an image indicated by image information of the present embodiment.

FIG. 14 is a diagram showing an example of an image Im2 showing the number of times of submergence of the present embodiment. The image information calculation section 127 of the present embodiment acquires submergence time information, which indicates the submergence time of each position of a gap (for example, the gap Ga) of the facing region A1, from the region information storage section 120, for example, when a command of the display of the submergence time is received from the operator. The image information calculation section 127 of the present embodiment calculates image information indicating an image, in which a figure showing the submergence time at each position of the gap Ga is disposed on the line between the center 133 of the substrate P and each position of the gap Ga, on the basis of the submergence time information. For example, for a rotational position around the center 133, the rotation angle of a second position 135 from a reference line 134 that is appropriately selected is assumed to be 0°. In the present embodiment, the region information storage section 120 creates a plot, which indicates the submergence time of the second position 135, at a position of an end point 136 of a vector v that has the center 133 as a starting point, has a rotation angle from the reference line of θ [°], and has a length proportional to the submergence time. The region information storage section 120 of the present embodiment creates a plot indicating the submergence time for each of the plurality of second positions 135 having a rotation angle that is appropriately selected from the range of 0° to 360°. In the present embodiment, the region information storage section 120 creates a smooth line 137 connecting a plurality of plots in order of the rotation angle, for example, by spline interpolation. The region information storage section 120 of the present embodiment calculates image information corresponding to an image including a figure showing the substrate P, a figure showing the gap Ga, and a figure showing the smooth line 137, for example.

The image information calculation section 127 of the present embodiment can also calculate the image information so that the above-described vector indicating the submergence time is displayed at each position of one point or two or more points designated by the operator, for example. In addition, the image information calculation section 127 of the present embodiment can also calculate the image information so that the vector indicating the submergence time and character information indicating the submergence time are displayed together. In the present embodiment, the image information calculation section 127 can also output image information based on the video format by forming an image indicating the distribution of the submergence time at each time and arranging such images in order of time.

In addition to the image showing the number of times of submergence and the image showing the submergence time, the image information calculation section 127 of the present embodiment can also generate an image showing at least one of various kinds of information including shot map information, first movement information, computation condition information, liquid information, region information, inspection information, and second movement information. For example, the image information calculation section 127 of the present embodiment can form an image for distinctively displaying a plurality of shot regions according to the probability that air bubbles are present in the immersion space LS during exposure. In addition, for example, the image information calculation section 127 of the present embodiment can form an image for distinctively displaying a plurality of shot regions according to the probability that separated liquid remains. The image information calculation section 127 of the present embodiment can generate an image showing one item of the various kinds of information described above, and can also generate an image showing a plurality of items together.

Incidentally, in the present embodiment, as shown in FIG. 1, the device manufacturing system 100 includes a plurality of substrate processing apparatuses 102, and the operating conditions may be varied in the plurality of substrate processing apparatuses 102. In the present embodiment, the information calculation unit 112 calculates various kinds of information on the basis of the information indicating the typical operating conditions in the plurality of substrate processing apparatuses 102. The typical operating conditions may be an average value in the plurality of substrate processing apparatuses 102, or may be a minimum value, or may be a maximum value. In the present embodiment, the comparison unit 113 compares the information calculated by the information calculation unit 112 with the apparatus information, and determines whether or not the information calculated by the information calculation unit 112 matches the apparatus information, for example. For example, in the present embodiment, the second movement information calculation section 126 calculates the second movement information on the basis of the typical operating conditions, and the comparison unit 113 determines whether or not the substrate stage 2P of each substrate processing apparatus 102 can move the substrate P according to the second movement information. The comparison unit 113 of the present embodiment can transmit information indicating a warning when it is determined that the substrate stage 2P of any one of the substrate processing apparatuses 102 cannot move the substrate P according to the second movement information. In addition, the comparison unit 113 of the present embodiment can also adjust (update) the apparatus information stored in the computation condition information storage section 116, for example, so that the second movement information calculation section 126 calculates the second movement information on the basis of the updated apparatus information. In addition, the information calculation unit 112 may calculate various kinds of information for each substrate processing apparatus 102 on the basis of the apparatus information of each substrate processing apparatus 102.

In the present embodiment, for example, the comparison unit 113 of the simulator 105 may compare the information regarding the separated liquid calculated by the information calculation unit 112 with the information indicating the detection result of the first detection system 7. For example, the comparison unit 113 compares the calculation result of the information calculation unit 112 regarding the distribution of the ease of remaining of separated liquid with the detection result of the first detection system 7 regarding the distribution of remaining of separated liquid. In addition, on the basis of the comparison result of the comparison unit 113, a coefficient and the like when calculating the distribution of the ease of remaining of separated liquid may be adjusted (updated) so that the calculation result of the information calculation unit 112 approaches the detection result of the first detection system 7. Such a comparison process may be performed by an apparatus other than the simulator 104, or may be performed by the host controller 104, or may be performed by the control device 105 of the exposure apparatus EX, for example.

In the present embodiment, for example, the comparison unit 113 of the simulator 105 may compare the information regarding air bubbles calculated by the information calculation unit 112 with the inspection result of the inspection apparatus 103. For example, the comparison unit 113 compares the calculation result of the information calculation unit 112 regarding the distribution of the probability that air bubbles are present in the immersion space LS during exposure with the detection result of the inspection apparatus 103 regarding the distribution of a region where exposure failure(s) has occurred in the exposed substrate P. In addition, on the basis of the comparison result of the comparison unit 113, a coefficient and the like when calculating the distribution of the probability that air bubbles are present in the immersion space LS during exposure may be adjusted (updated) so that the calculation result of the information calculation unit 112 approaches the detection result of the inspection apparatus 103. Such a comparison process may be performed by an apparatus other than the simulator 104, or may be performed by the host controller 104, or may be performed by the control device 105 of the exposure apparatus EX, for example.

In the present embodiment, for example, the coefficient and the like updated as described above by the comparison unit 113 of the simulator 105 may be stored in the computation condition information storage section 116. In the present embodiment, the information calculation unit 112 can also calculate various kinds of information again on the basis of the updated computation condition information. For example, it is also possible to calculate third movement information on the basis of the updated information. The third movement information includes at least one of the position information, speed information, and acceleration information of the substrate stage 2P (substrate P). For example, the second movement information calculation section 126 can calculate the third movement information on the basis of the inspection information of the substrate P that has been moved according to the second movement information. In addition, on the basis of a result obtained when the inspection apparatus 103 inspects the substrate P that has been exposed while being moved according to the second movement information, the second movement information calculation section 126 can also calculate the third movement information so that exposure failures due to the remaining of separated liquid, mixing of air bubbles into the immersion space LS, and the like are reduced. In addition, on the basis of a result obtained when the first detection system 7 detects the movement of the liquid on the substrate P moving according to the second movement information, the second movement information calculation section 126 may calculate the third movement information so that the remaining of separated liquid is reduced. In addition, the method of adjusting the moving path of the substrate P when calculating the third movement information may be, for example, a method using independently one of the overscan method, the reduce scan speed method, and the pause method described above, or may be a method using two or more of these methods in combination.

In the present embodiment, the output unit 114 shown in FIG. 7 outputs at least some of the information, which is stored in the information storage unit 111, to the outside of the simulator 105. For example, the output unit 114 of the present embodiment outputs the second movement information stored in the information storage unit 111 to the host controller 104. In the present embodiment, the host controller 104 outputs the second movement information, which is output from the output unit 114, to the control device 4 of the exposure apparatus EX. That is, the second movement information is output from the simulator 105 to the exposure apparatus EX through the host controller 104. The exposure apparatus EX moves the substrate stage 2P according to the second movement information supplied from the simulator 105. The output unit 114 of the present embodiment can also output the information stored in the information storage unit 111 to recording media, such as an optical disc and a memory device.

In addition, the output unit 114 of the present embodiment outputs the image information stored in the information storage unit 111 to a display device (not shown). This display device displays an image, which shows various kinds of information stored in the information storage unit 111, according to the image information output from the output unit 114. This display device may be attached to the simulator 105, or may be attached to the host controller 104, or may be attached to the exposure apparatus EX and the like. For example, the output unit 114 of the present embodiment may output the image information stored in the information storage unit 111 to the host controller 104, and the host controller 104 may display an image, which shows various kinds of information stored in the information storage unit 111, on the display device. In addition, this display device may be a device provided outside the device manufacturing system 100.

In addition, the information output from the simulator 105 may be one item or two or more items of the various kinds of information described above. In addition, as the information output from the simulator 105, only information regarding some regions of the facing region A1 may be output, or information regarding the entire region of the facing region A1 may be output. For example, the simulator 105 may output information regarding a specific region designated by the command of the operator or the like.

Figure 15:
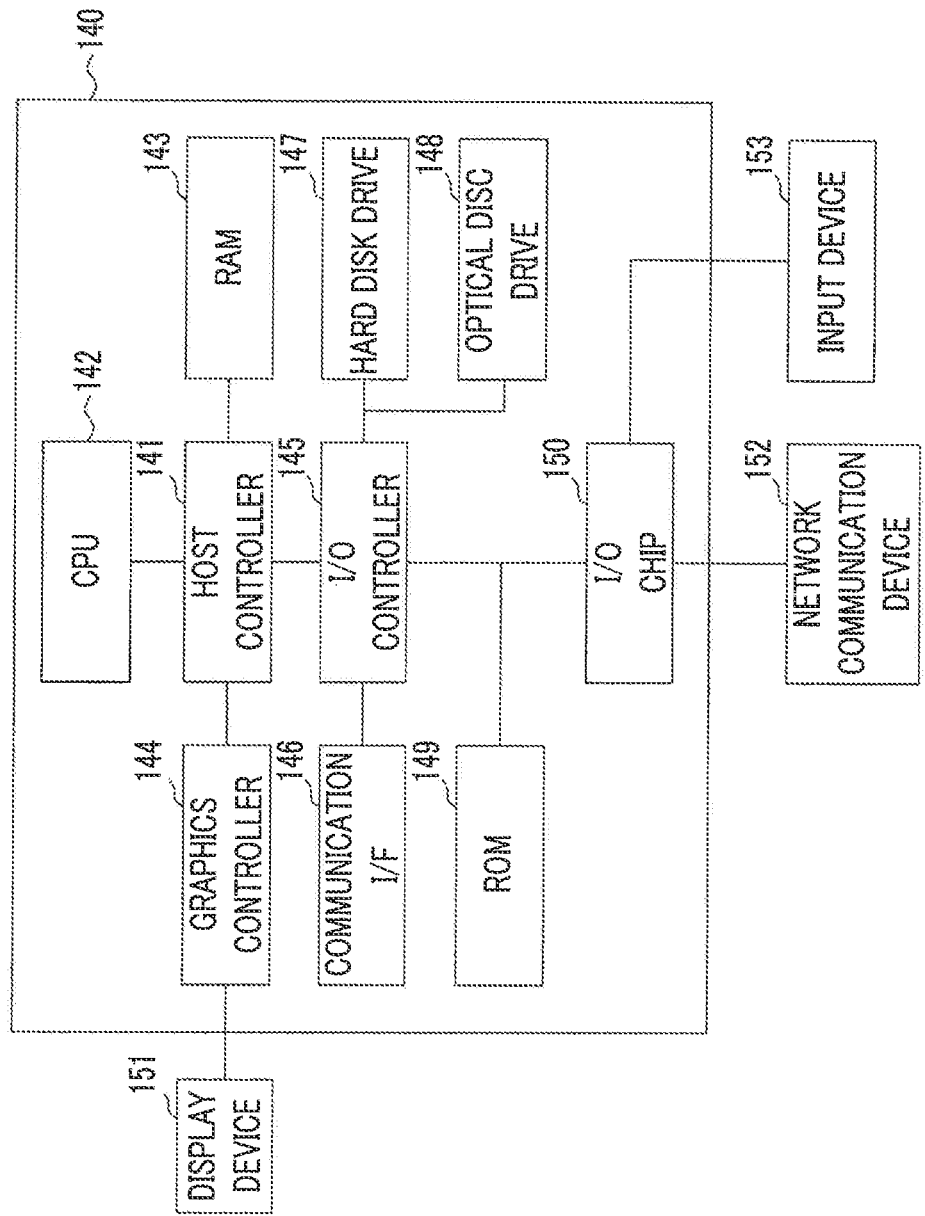
FIG. 15 is a diagram showing an example of the configuration of a computer system of the present embodiment.

Next, an example of the configuration of a computer that functions as the simulator 105 will be described with reference to FIG. 15. FIG. 15 is a diagram showing an example of the hardware configuration when the simulator 105 is formed using an electronic information processing apparatus, such as a computer.

A computer 140 shown in FIG. 15 includes a central processing unit (CPU) peripheral unit, an input/output unit, and a legacy input/output unit. The CPU peripheral unit includes a CPU 142, a random access memory (RAM) 143, and a graphics controller 144 that are connected to each other through a host controller 141. The input/output unit includes a communication interface 146, a hard disk drive 147, and an optical disc drive 148 that are connected to the host controller 141 through an input/output controller 145. The legacy input/output unit includes a read only memory (ROM) 149 and an input/output chip 150 that are connected to the input/output controller 145.

The host controller 141 connects the RAM 143, the CPU 142 that accesses the RAM 143 at the high transfer rate, and the graphics controller 144 to each other. The CPU 142 operates on the basis of programs, which are stored in the ROM 149 and the RAM 143, to control each unit. The graphics controller 144 acquires image data, which is generated on a frame buffer provided in the RAM 143 by the CPU 142 and the like, and displays the image data on a display device 151. Instead of this, the graphics controller 144 may include a frame buffer to store the image data generated by the CPU 142 and the like.

The input/output controller 145 connects the host controller 141, the hard disk drive 147 that is a relatively high-speed input/output device, the communication interface 146, and the optical disc drive 148 to each other. The hard disk drive 147 stores a program and data that the CPU 142 uses. The communication interface 146 is connected to a network communication device 152 in order to transmit or receive a program or data. The optical disc drive 148 reads a program or data from an optical disc and provides the program or the data to the hard disk drive 147 and the communication interface 146 through the RAM 143.

The ROM 149 and a relatively low-speed input/output device of the input/output chip 150 are connected to the input/output controller 145. A boot program executed at the start time of the simulator 105 or a program that depends on the hardware of the simulator 105 is stored in the ROM 149. The input/output chip 150 connects various kinds of input devices 153, such as a keyboard, a mouse, a track ball, and a touch panel, through a parallel port, a serial port, a keyboard port, a mouse port, and the like.

The program executed by the CPU 142 is provided to the user in a state being stored in recording media, such as an optical disc and an integrated circuit (IC) card. The program stored in the recording media may be compressed or may not be compressed. The program is installed in the hard disk drive 147 from the recording media, is read out to the RAM 143, and is executed by the CPU 142. The program executed by the CPU 142 causes the computer 140 to function as each functional unit of the simulator 105 shown in FIG. 7.

That is, in the present embodiment, the above-described program may be a program causing a computer to calculate information regarding an immersion space in a first surface that can face an optical member that irradiates an object with exposure light through the immersion space, and the program may cause a computer to execute: calculating liquid information regarding the movement of a liquid on an object, which faces an optical member that emits exposure light, when moving the object, the liquid being located between the object and the optical member; and calculating region information indicating a region of a surface of the object where the liquid information satisfies predetermined conditions.

In the present embodiment, the above-described program may be a program causing a computer to calculate information regarding an immersion space in a first surface that can face an optical member that irradiates an object with exposure light through the immersion space, and the program may cause a computer to execute: calculating liquid information regarding the movement of a liquid on an object, which faces an optical member that emits exposure light, on the basis of the first movement information indicating the movement of the object, the liquid being located between the object and the optical member; and calculating second movement information indicating the movement of the object on the basis of the liquid information.

In the present embodiment, the above-described program may be a program causing a computer to calculate information regarding a liquid in an object that can face an optical member that irradiates the object with exposure light through an immersion space, and the program may cause a computer to execute calculating the second movement information, which indicates the movement of an object facing an optical member that emits exposure light, on the basis of a detection result of the remaining of a liquid on the object moved according to the first movement information, the liquid being located between the object and the optical member. When the remaining of the liquid is detected in a first path from a first shot region to a second shot region indicated by the first movement information, the second movement information may be calculated such that a path from the first shot region to the second shot region is longer than the first path.

In the present embodiment, the above-described program may be a program causing a computer to calculate information regarding a liquid in an object that can face an optical member that irradiates the object with exposure light through an immersion space, and the program may cause a computer to execute calculating the second movement information, which indicates the movement of a substrate facing an optical member that emits exposure light, on the basis of an inspection result of exposure failures of the substrate that is exposed while being moved according to the first movement information, the liquid being located between the substrate and the optical member. When the exposure failure are detected in a shot region of the substrate, the second movement information may be calculated such that a path of the substrate up to the shot region is long compared with the first movement information.

In addition, the control device 4 of the exposure apparatus EX may include the above-described computer. In addition, the host controller 104 of the device manufacturing system 100 may include the above-described computer.

The program shown above may be stored on an external storage medium. Not only a flexible disk and a CD-ROM but also optical recording media such as a digital versatile disk (DVD) or a phase disk (PD), magneto-optical recording media such as a minidisk (MD), tape media, a semiconductor memory such as an IC card, and the like can be used as storage media. In the present embodiment, computer-readable recording media include a magnetic disk, a magneto-optical disc, a CD-ROM, a DVD-ROM, a semiconductor memory, and the like. In addition, a program may be distributed through the communication line, and the computer 140 may execute the program according to the distribution. In addition, at least one component of the simulator 105 may be formed by hardware, such as an ASIC.

Figure 16:
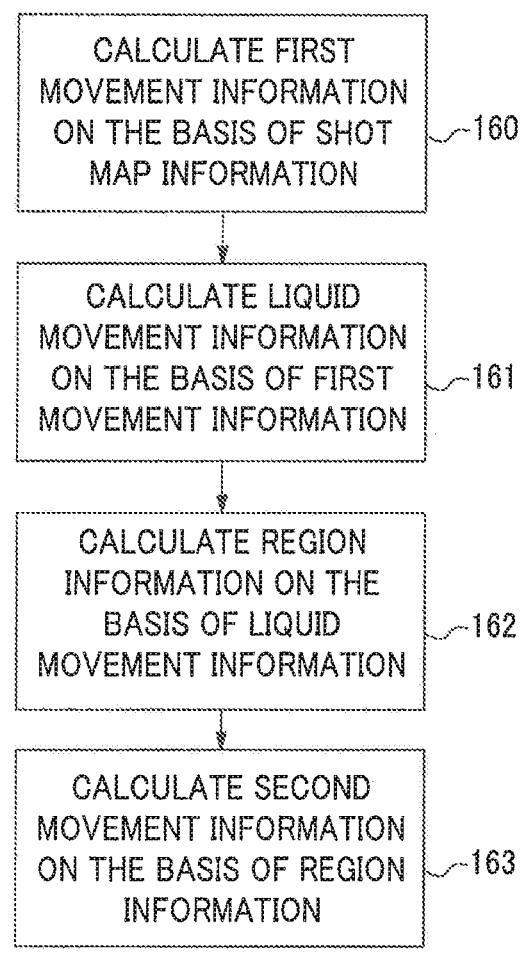
FIG. 16 is a flowchart showing an information calculation method of the present embodiment.

Next, an information calculation method of the present embodiment will be described. FIG. 16 is a flowchart showing the information calculation method of the present embodiment. The information calculation method of the present embodiment can be performed by the simulator 105 described above, for example.

In the present embodiment, the first movement information calculation section 123 of the simulator 105 shown in FIG. 7 calculates the first movement information on the basis of the shot map information in step 160 shown in FIG. 16. In the present embodiment, the liquid information calculation section 124 calculates the liquid information on the basis of the first movement information in step 161. In the present embodiment, the region information calculation section 120 calculates the region information on the basis of the liquid information in step 162. In the present embodiment, the second movement information calculation section 126 calculates the second movement information on the basis of the region information in step 163.

Figure 17:
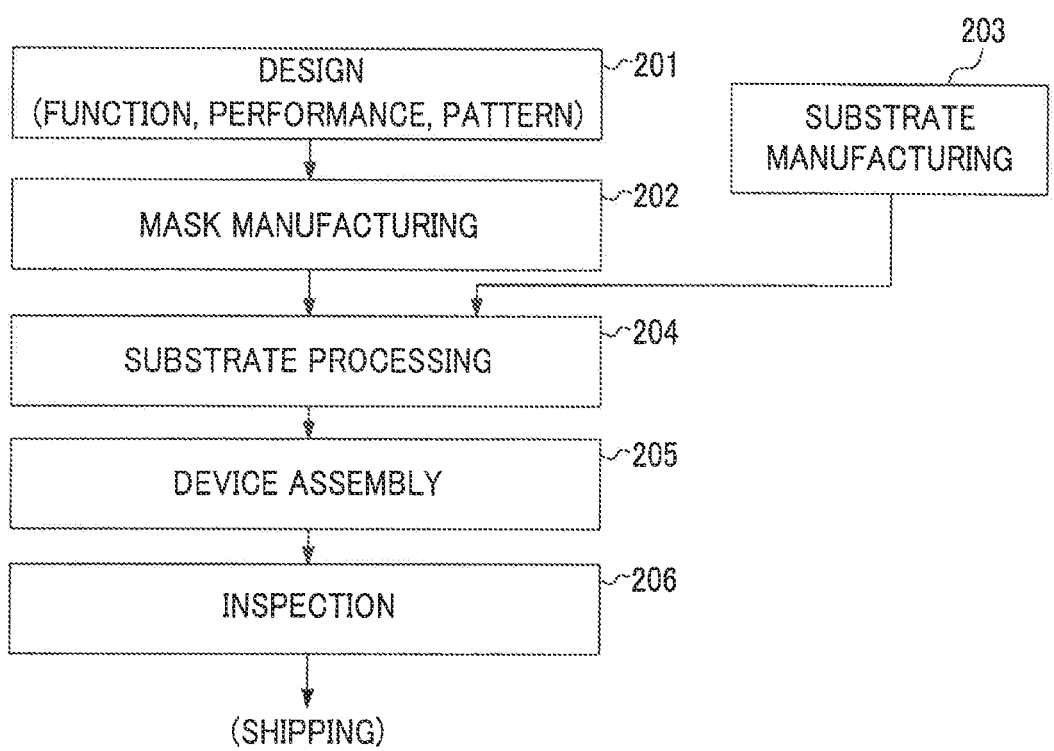
FIG. 17 is a flowchart showing a device manufacturing method of the present embodiment.

Next, a device manufacturing method of the present embodiment will be described. FIG. 17 is a flowchart indicating the device manufacturing method of the present embodiment. The device manufacturing method of the present embodiment can be performed by the device manufacturing system 100 described above, for example.

As shown in FIG. 17, a microdevice, such as a semiconductor device, is manufactured through: a step 201 of designing the functions and performance of the microdevice; a step 202 of manufacturing a mask (reticle) based on this design step; a step 203 of manufacturing a substrate that is a base of the device; a substrate processing step 204 including substrate processing (exposure process) that includes exposing the substrate with exposure light from the pattern of the mask and developing the exposed substrate in accordance with the embodiment described above; a device assembly step 205 (which includes fabrication processes such as a dicing process, a bonding process, and a packaging process); an inspection step 206; and the like.

In the information calculation method of the present embodiment described above, since the information regarding the movement of the immersion space LS is calculated, it is possible to estimate the separation of the liquid from the immersion space LS and the mixing of air bubbles into the immersion space LS, for example. Therefore, it is possible to suppress the occurrence of exposure failure. In addition, in the information calculation method of the present embodiment, for example, the separation of the liquid from the immersion space LS and the mixing of air bubbles into the immersion space LS can be estimated by comparing the relationship between the interface 131 of the immersion space LS and the object with the predetermined conditions. Therefore, since the need to solve the flow field inside the immersion space LS is reduced, it is possible to reduce the load required for the calculation of information. In addition, in the information calculation method of the present embodiment, region information indicating a region where the relationship between the interface 131 of the immersion space LS and the object satisfies the predetermined conditions is calculated. Therefore, it is possible to obtain the information of a region where the liquid is easily separated from the immersion space LS and a region where air bubbles are easily mixed into the immersion space LS, for example. In addition, in the information calculation method of the present embodiment, since the second movement information is calculated on the basis of the liquid information, it is possible to suppress the remaining of separated liquid on the facing surface 130, the remaining of air bubbles in the immersion space LS, and the like, for example. As a result, it is possible to suppress the occurrence of exposure failure by the exposure apparatus EX and the exposure method of the present embodiment. In addition, it is possible to suppress the generation of defective devices by the device manufacturing system 100 and the device manufacturing method of the present embodiment.

In addition, although the simulator 105 calculates various kinds of information described above, at least some of the various kinds of information may not be calculated. In this case, at least some components of the simulator 105 may be omitted. In addition, the above method of using various kinds of information calculated by the simulator 105 is an example, and is not limited to the above example.

For example, although the simulator 105 of the present embodiment calculates the first movement information, the first movement information may not be calculated. For example, an apparatus that is different from the simulator 105 may calculate the first movement information, and the simulator 105 may acquire the first movement information from the different apparatus. In this case, the simulator 105 may not include the shot map information storage section 115, the first movement information calculation section 118, and the like, for example. In addition, the apparatus that calculates the first movement information may be a part of the exposure apparatus EX, or may be an apparatus other than the exposure apparatus EX in the device manufacturing system 100, or may be an apparatus provided outside the device manufacturing system 100, for example. In addition, the first movement information may be calculated without being based on the shot map information, or may not be calculated. For example, the simulator 105 may calculate information on the basis of the first movement information set appropriately.

In addition, although the simulator 105 of the present embodiment calculates the liquid information, the liquid information may not be calculated. For example, on the basis of a result obtained when inspecting the remaining of liquid in the object that is moved according to the first movement information, the simulator 105 may calculate the second movement information so that the remaining of liquid is suppressed using the overscan method or the like. In addition, for example, on the basis of a result obtained when inspecting the exposure failure of the substrate that is exposed while being moved according to the first movement information, the simulator 105 may calculate the second movement information so that the mixing of air bubbles, the remaining of liquid, and the like are suppressed using the overscan method or the like. In such a case, the simulator 105 may not estimate the movement of the liquid, or may not include the liquid information calculation section 124.

In addition, although the simulator 105 of the present embodiment calculates the region information, the region information may not be calculated. For example, the simulator 105 may calculate the second movement information directly from the liquid information, without calculating the region information from the liquid information. In such a case, the simulator 105 may not include the region information calculation section 125.

In addition, although the simulator 105 of the present embodiment calculates the second movement information, the second movement information may not be calculated. For example, the operator may not use the second movement information, or may adjust the arrangement of the shot region on the basis of the liquid information. In addition, the second movement information may be calculated by an apparatus that is different from the simulator 105. In this case, the apparatus that calculates the second movement information may be a part of the exposure apparatus EX, or may be an apparatus other than the exposure apparatus EX in the device manufacturing system 100, or may be an apparatus provided outside the device manufacturing system 100. In addition, the second movement information may not be supplied from the simulator 105 to the exposure apparatus EX. Without the second movement information being supplied from the simulator 105 to the exposure apparatus EX, the exposure apparatus EX may suppress the generation of the separated liquid, the remaining of air bubbles in the immersion space LS, and the like by performing an operation of overscan, reduce scan speed, pause, dummy shot, and the like, for example.

In addition, although the simulator 105 of the present embodiment calculates the image information, the image information may not be calculated. For example, the simulator 105 may output the liquid information, the region information, the second movement information, and the like as numerical data. The image information may be calculated by an apparatus that is different from the simulator 105. The different apparatus may be a part of the exposure apparatus EX, or may be an apparatus other than the exposure apparatus EX in the device manufacturing system 100, or may be an apparatus provided outside the device manufacturing system 100.

Although the simulator 105 of the present embodiment calculates the information regarding air bubbles, the information regarding air bubbles may not be calculated. For example, the operator may estimate the mixing of air bubbles into the immersion space LS, the remaining of air bubbles in the immersion space LS, and the like on the basis of the information output from the simulator 105. In addition, although the simulator 105 of the present embodiment calculates the information regarding the separation of the liquid LQ from the immersion space LS, the information regarding the separation of the liquid LQ from the immersion space LS may not be calculated. For example, the operator may estimate the separation of the liquid LQ from the immersion space LS, the remaining of separated liquid on the facing surface 130, and the like on the basis of the information output from the simulator 105.

In addition, although the simulator 105 acquires the inspection information and the apparatus information in the present embodiment, one or both of the inspection information and the apparatus information may not be acquired. For example, the simulator 105 may not use one or both of the inspection information and the apparatus information when calculating information, or may not compare the calculated information with one or both of the inspection information and the apparatus information.

In addition, although the simulator 105 is a different apparatus from the host controller 104 in the present embodiment, at least some components of the simulator 105 may be included in the host controller 104, or may be included in the exposure apparatus EX, or may be included in an apparatus other than the host controller 104 and the exposure apparatus EX of the device manufacturing system 100.

In addition, although the object facing the terminating optical element 12 includes the gaps Ga and Gb in the present embodiment, one or both of the gaps Ga and Gb may not be included, or a gap other than the gaps Ga and Gb may be included. In addition, the exposure apparatus EX may not include one or both of the cover member 21 and the scale member 22. The simulator 105 may calculate information regarding the immersion space LS when the object does not have a gap. In addition, in a state where the conditions in which various kinds of phenomena, such as the separation of the liquid in the immersion space LS, occur are calculated by experimental methods, methods based on the CFD, and the like, the simulator 105 may estimate whether or not each phenomenon has occurred by comparing the calculated information regarding the movement of the liquid with the conditions in which various kinds of phenomena occur.

In addition, in each embodiment described above, the optical path on the emission side (image surface side) of the terminating optical element 12 of the projection optical system PL is filled with the liquid LQ. However, for example, as disclosed in Pamphlet of International Publication No. 2004/019128, it is possible to adopt the projection optical system PL in which the optical path on the incidence side (object surface side) of the terminating optical element 12 is also filled with the liquid LQ.

In addition, although water is used as the liquid LQ in each embodiment described above, a liquid other than water may be used. As the liquid LQ, a liquid which is transmissive with respect to the exposure light EL, which has a high refractive index with respect to the exposure light EL, and which is stable with respect to a film of a photosensitive material (photoresist) or the like that forms the surface of the projection optical system PL or the substrate P is preferable. For example, hydrofluoroether (HFE), perfluorinated polyether (PFPE), Fomblin oil, and the like can be used as the liquid LQ. In addition, various fluids, for example, a supercritical fluid, can be used as the liquid LQ.

In addition, the substrate P of each embodiment described above is not limited to a semiconductor wafer for manufacturing semiconductor devices, but can also be applied to a glass substrate for display devices, a ceramic wafer for thin film magnetic heads, or the original plate (synthetic quartz glass or a silicon wafer) of a mask or a reticle used by the exposure apparatus.

The exposure apparatus EX can be applied not only to a step-and-scan type scanning exposure apparatus (scanning stepper) that scans and exposes the pattern of the mask M by synchronously moving the mask M and the substrate P but also to a step-and-repeat type projection exposure apparatus (stepper) that performs a full-field exposure of the pattern of the mask M with the mask M and the substrate P in a stationary state and performs successive step movement of the substrate P.

In addition, when performing step-and-repeat-type exposure, after a reduced image of a first pattern is transferred onto the substrate P using a projection optical system in a state where the first pattern and the substrate P are almost stationary, a reduced image of a second pattern may be exposed in a batch on the substrate P so as to partially overlap the first pattern using the projection optical system in a state where the second pattern and the substrate P are almost stationary (stitching type full-field exposure apparatus). In addition, as the stitching type exposure apparatus, the present invention can be applied to a step-and-stitch-type exposure apparatus in which at least two patterns are transferred onto the substrate P so as to partially overlap each other and the substrate P is sequentially moved.

In addition, for example, as disclosed in U.S. Pat. No. 6,611,316, the present invention can also be applied to an exposure apparatus that combines the patterns of two masks on a substrate through a projection optical system and double exposes a shot region on the substrate almost simultaneously using a single scanning exposure. In addition, the present invention can also be applied to a proximity type exposure apparatus, a mirror projection aligner, and the like.

Figure 18:
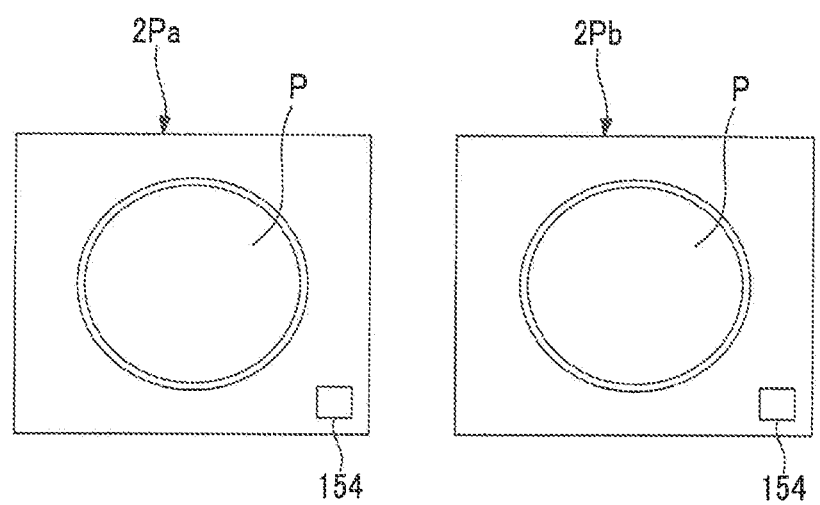
FIG. 18 is a diagram for explaining an example of an exposure apparatus.

In addition, the present invention can also be applied to a twin stage type exposure apparatus including a plurality of substrate stages, for example, as disclosed in U.S. Pat. Nos. 6,341,007, 6,208,407, and 6,262,796. For example, as shown in FIG. 18, when the exposure apparatus EX includes two substrate stages 2Pa and 2Pb, an object that can be disposed so as to face the emission surface 13 (that can form the immersion space LS) includes at least one of one substrate stage, a substrate held on a substrate holding part of one substrate stage, the other substrate stage, and a substrate held on a substrate holding part of the other substrate stage. In addition, the second substrate stage 2Pb may be disposed at a surrounding of the first substrate stage 2Pa with a gap formed between the first and second substrate stages 2Pa and 2Pb or with substantially no gap therebetween. In this case, the immersion space LS may be moved across the first and second substrate stages 2Pa and 2Pb. The simulator 105 described above can also calculate information regarding the immersion space LS. In addition, a member 154 may be disposed in one or both of the two substrate stages 2Pa and 2Pb, as shown in FIG. 18. For example, the member 154 may be one or both of a measuring member and a measuring device. The number of members 154 disposed on the substrate stage may be 2 or more. In addition, the member 154 disposed on the substrate stage 2Pa may be the same as or different from the member 154 disposed on the substrate stage 2Pb.

In addition, in each embodiment described above, the exposure apparatus EX may be an exposure apparatus including a plurality of substrate stages and a plurality of measuring stages.

Types of the exposure apparatus EX are not limited to an exposure apparatus for semiconductor device manufacturing that exposes a semiconductor device pattern on the substrate P, and the present invention can also be widely applied to an exposure apparatus for manufacturing a liquid crystal display device or a display, an exposure apparatus for manufacturing a thin film magnetic head, an image capturing device or an image sensing device (CCD), a micromachine, a MEMS, a DNA chip, or a reticle or a mask, and the like.

In addition, in each embodiment described above, for example, the position of each stage is measured using an encoder system that detects the scale (diffraction grating) provided in each stage. However, the encoder system may not be provided.

In addition, in the embodiment described above, a light-transmissive mask is used in which a prescribed light-shielding pattern (or a phase pattern or a attenuating pattern) is formed on the light-transmissive substrate. However, instead of such a mask, a variable pattern forming mask (also called an electronic mask, an active mask, or an image generator) to form a transmissive pattern, a reflective pattern, or a light emitting pattern on the basis of electronic data of the pattern to be exposed may be used, for example, as disclosed in U.S. Pat. No. 6,778,257. In addition, instead of a variable pattern forming mask that includes a non-emissive type image display device, a pattern forming apparatus that includes a self luminous type image display device may be provided.

In each embodiment described above, an exposure apparatus including the projection optical system PL has been described as an example. However, the present invention can also be applied to an exposure apparatus and an exposure method that do not use the projection optical system PL. For example, it is possible to form an immersion space between an optical member, such as a lens, and a substrate and irradiate the substrate with exposure light through the optical member.

In addition, for example, as disclosed in Pamphlet of International Publication No. 2001/035168, the present invention can also be applied to an exposure apparatus (lithographic system) that exposes a line-and-space pattern on the substrate P by forming interference fringes on the substrate P.

The exposure apparatus EX of the embodiment described above is manufactured by assembling various subsystems, which include respective components, so that the prescribed mechanical precision, electrical precision and optical precision can be maintained. In order to ensure these respective precisions, adjustments for achieving optical precision with respect to the various optical systems, adjustments for achieving mechanical precision with respect to the various mechanical systems, and adjustments for achieving electrical precision with respect to the various electrical systems are performed before and after this assembly. The process of assembly from the various subsystems to the exposure apparatus includes mechanical connections, electrical circuit wiring connections, piping and connection of the atmospheric pressure circuit, and the like among the various subsystems. Obviously, before the process of assembly from these various subsystems to the exposure apparatus, there are the processes of individual assembly of the respective subsystems. When the process of assembly to the exposure apparatuses of the various subsystems has ended, overall assembly is performed, and the various precisions are ensured for the exposure apparatus as a whole. In addition, it is preferable that the exposure apparatus be manufactured in a clean room where the temperature, the degree of cleanness, and the like are controlled.

In addition, the requirements of the above embodiments and modified examples can be appropriately combined with each other. In addition, some components may not be used. In addition, as far as is permitted by law, the disclosures in all of the Japanese Patent Publications and US Patents related to the exposure apparatuses and the like cited in the above embodiments and modified examples are incorporated herein by reference.

What is claimed is:

1. An information calculation method to suppress exposure failure in an immersion exposure apparatus, the method comprising:
    calculating, using a processor, liquid information regarding a position of a liquid on an upper surface of an object based on a first movement path of the object, the upper surface of the object including an upper surface of a substrate on which a plurality of shot regions for exposure are defined and an upper surface of a movable stage by which the substrate is held, the upper surface of the object facing an optical member from which exposure light is projected to the substrate, the first movement path being for exposing the plurality of shot regions and being decided based on an arrangement of the plurality of shot regions, each of the plurality of shot regions being exposed while moving the substrate in at least one scanning direction;
    storing the calculated liquid information in memory;
    calculating, using the processor, region information identifying one or more of the shot regions where occurrence of exposure failure is predicted, based on the calculated liquid information;
    storing the calculated region information in the memory; and calculating, using the processor, second movement information to control movement of the object for exposure of the plurality of shot regions, the second movement information being calculated to reduce the predicted exposure failure, wherein the second movement information includes a second movement path to control movement of the object for exposure of the plurality of shot regions, and the second movement path is different from the first movement path, wherein the first movement path includes a scanning path for exposing a certain shot region of the plurality of shot regions and a first stepping path after completion of the exposure of the certain shot region and before start of exposure of a next shot region of the plurality of shot regions, wherein the second movement path includes the scanning path for exposing the certain shot region and a second stepping path after completion of the exposure of the certain shot region and before start of the exposure of the next shot region, wherein the at least one scanning direction includes a first scanning direction and a second scanning direction opposite to the first scanning direction, and the certain shot region is exposed while moving the substrate in the first scanning direction and the next shot region is exposed while moving the substrate in the second scanning direction, and wherein a distance of a movement in the first scanning direction in the second stepping path is longer than that in the first stepping path.

2. The method according to claim 1, wherein the certain shot region and the next shot region are arranged adjacent to each other in a direction perpendicular to the at least one scanning direction.

3. The method according to claim 2, wherein an immersion space at which the liquid is provided is over a first gap between the upper surface of the substrate and the upper surface of the movable stage during a first period of the first stepping path, wherein the immersion space is over a second gap between the upper surface of the substrate and the upper surface of the movable stage during a second period of the second stepping path, and wherein a distance between the second gap and an interface of the immersion space formed outside the substrate during the second period is longer than a distance between the first gap and the interface of the immersion space formed outside the substrate during the first period.

4. The method according to claim 2, wherein a contact state between an immersion space at which the liquid is provided and the next shot region is maintained during the whole of a first period of the first stepping path, and wherein the next shot region and the immersion space are once separated during a second period of the second stepping path.

5. The method according to claim 4, wherein the immersion space is over a gap between the upper surface of the substrate and the upper surface of the movable stage before exposing the certain shot region.

6. An exposure method comprising:

preparing a substrate; and exposing the substrate based on the second movement information calculated by using the method defined in claim 1.

7. A semiconductor-device manufacturing method comprising:

exposing a substrate based on the second movement information calculated by using the method defined in claim 1; and developing the exposed substrate.

* * * * *